(12) United States Patent
Park et al.

(10) Patent No.: US 11,735,498 B2
(45) Date of Patent: Aug. 22, 2023

(54) THROUGH VIA ELECTRODE AND DEVICE ISOLATION STRUCTURE INCLUDING OXIDE LAYER PATTERN AND NITRIDE LAYER PATTERN SEQUENTIALLY STACKED ON INNER SURFACE OF TRENCH

(71) Applicant: Samsung Electronics Co., Ltd., Suwon-si (KR)

(72) Inventors: Kwangwuk Park, Seoul (KR); Youngmin Lee, Hwaseong-si (KR); Sungdong Cho, Hwaseong-si (KR); Eunji Kim, Seoul (KR); Hyoungyol Mun, Yongin-si (KR); Seokhwan Jeong, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 126 days.

(21) Appl. No.: 17/213,767

(22) Filed: Mar. 26, 2021

(65) Prior Publication Data

US 2022/0020667 A1  Jan. 20, 2022

(30) Foreign Application Priority Data

Jul. 20, 2020 (KR) .................. 10-2020-0089468

(51) Int. Cl.
| | |
|---|---|
| H01L 23/48 | (2006.01) |
| H01L 21/762 | (2006.01) |
| H01L 25/065 | (2023.01) |
| H01L 21/768 | (2006.01) |

(52) U.S. Cl.
CPC ...... *H01L 23/481* (2013.01); *H01L 21/76232* (2013.01)

(58) Field of Classification Search
CPC ......... H01L 21/76232; H01L 21/76898; H01L 21/76229; H01L 21/02164; H01L 21/0217; H01L 23/481; H01L 25/0657
See application file for complete search history.

(56) References Cited

U.S. PATENT DOCUMENTS

| | | |
|---|---|---|
| 7,402,903 B2 | 7/2008 | Matsuo |
| 7,816,227 B2 | 10/2010 | Chen et al. |
| 7,985,655 B2 | 7/2011 | Smith |
| 8,704,375 B2 | 4/2014 | Liu et al. |

(Continued)

FOREIGN PATENT DOCUMENTS

KR  2015-0133520 A  11/2015

*Primary Examiner* — Herve-Louis Y Assouman
(74) *Attorney, Agent, or Firm* — Harness, Dickey & Pierce, P.L.C.

(57) ABSTRACT

A semiconductor includes a substrate having a first surface and a second surface opposite to each other, the substrate having a via hole extending in a thickness direction from the first surface, a circuit pattern in the first surface of the substrate, a through electrode structure in the via hole, a device isolation structure in a first trench extending in one direction in the first surface of the substrate, the device isolation structure between the via hole and the circuit pattern, the device isolation structure including a first oxide layer pattern and a first nitride layer pattern sequentially stacked on an inner surface of the first trench, the first nitride layer pattern filling the first trench, and an insulation interlayer on the first surface of the substrate and covering the circuit pattern.

19 Claims, 22 Drawing Sheets

(56) References Cited

U.S. PATENT DOCUMENTS

| | | |
|---|---|---|
| 8,841,200 B2 | 9/2014 | Cheng et al. |
| 8,937,368 B2 | 1/2015 | Harada et al. |
| 9,059,263 B2 | 6/2015 | Ramachandran et al. |
| 9,252,141 B2 | 2/2016 | Moon et al. |
| 9,293,415 B2 | 3/2016 | Kim et al. |
| 9,577,035 B2 | 2/2017 | Hurwitz et al. |
| 9,613,847 B2 | 4/2017 | Bachman et al. |
| 10,199,273 B2 | 2/2019 | Kuo et al. |
| 10,490,556 B1* | 11/2019 | Su ........................ H01L 21/0234 |
| 2002/0086495 A1* | 7/2002 | Yoo .................... H01L 21/76229 |
| | | 438/424 |
| 2007/0181966 A1* | 8/2007 | Watatani ........... H01L 21/76224 |
| | | 257/E21.546 |
| 2013/0049161 A1* | 2/2013 | Piper ................. H01L 21/76232 |
| | | 257/E21.546 |
| 2013/0140680 A1* | 6/2013 | Harada ................... H01L 29/78 |
| | | 257/621 |
| 2015/0303108 A1 | 10/2015 | Kuo et al. |
| 2019/0378844 A1* | 12/2019 | Chen ................. H01L 27/10897 |

\* cited by examiner

THROUGH VIA ELECTRODE AND DEVICE ISOLATION STRUCTURE INCLUDING OXIDE LAYER PATTERN AND NITRIDE LAYER PATTERN SEQUENTIALLY STACKED ON INNER SURFACE OF TRENCH

PRIORITY STATEMENT

This application claims priority under 35 U.S.C. § 119 to Korean Patent Application No. 10-2020-0089468, filed on Jul. 20, 2020 in the Korean Intellectual Property Office (KIPO), the contents of which are herein incorporated by reference in their entirety.

BACKGROUND

Some example embodiments relate to a semiconductor device and a method of manufacturing the semiconductor device. More particularly, example embodiments relate to a semiconductor device including a through electrode and/or a method of manufacturing the same.

In the recent HBM (High Bandwidth Memory) product market, development of a through silicon via (TSV) having a low capacitance and/or capable of implementing high-speed characteristics is required/desired. Accordingly, a thickness of a liner oxide layer formed around a through electrode for insulation from a substrate low capacitance may be decreased to provide a low capacitance. However, as the thickness of the liner oxide layer is increased, there is a problem in that the influence on elements around the through electrode increases.

SUMMARY

Some example embodiments provide a semiconductor device having an isolation structure capable of reducing device influences on elements around a through electrode.

Some example embodiments provide a method of manufacturing the semiconductor device.

According to some example embodiments, a semiconductor device includes a substrate having a first surface and a second surface opposite to each other, the substrate having a via hole extending in a thickness direction from the first surface, a circuit pattern in the first surface of the substrate, a through electrode structure in the via hole, a device isolation structure in a first trench extending in one direction in the first surface of the substrate, the device isolation structure between the via hole and the circuit pattern, the device isolation structure including a first oxide layer pattern and a first nitride layer pattern sequentially stacked on an inner surface of the first trench, the first nitride layer pattern filling the first trench, and an insulation interlayer on the first surface of the substrate and covering the circuit pattern.

According to some example embodiments, a semiconductor device includes a substrate having a first region and a second region, a circuit pattern in the first region of the substrate, a through electrode structure penetrating through at least a portion of the second region of the substrate, a first isolation structure in a first trench, the first isolation structure extending in one direction in the substrate and defining the first region, the first isolation structure including a first oxide layer pattern and a first nitride layer pattern sequentially stacked on an inner surface of the first trench, the first nitride pattern filling the first trench, and an insulation interlayer on the substrate and covering the circuit pattern.

According to some example embodiments, a semiconductor device includes a substrate having a circuit region, a via region, and a buffer region between the circuit region and the via region, a circuit pattern in the circuit region of the substrate, a through electrode structure penetrating at least a portion of the via region of the substrate, a device isolation structure in a first trench extending in one direction in the substrate, the device isolation structure defining the circuit region, and including a first oxide layer pattern on an inner surface of the first trench and a first nitride layer pattern on the first oxide layer, the first nitride layer pattern filling a remaining portion of the first trench, at least one dummy isolation structure in at least one second trench extending in one direction in the substrate, the at least one dummy isolation structure in the buffer region, the at least one dummy isolation structure including a second oxide layer pattern on an inner surface of the second trench and a second nitride layer pattern on the second oxide layer pattern, the second nitride layer filling a remaining portion of the second trench, and an insulation interlayer on the substrate and covering the circuit pattern. The first trench is spaced apart from the through electrode structure by a distance of between 5 μm to 15 μm.

According to some example embodiments, a semiconductor device may include a device isolation structure provided in a first trench extending in one direction in a first surface of a substrate between a via hole and a circuit pattern. The device isolation structure may include a first oxide layer pattern on an inner surface of the first trench and a first nitride layer pattern on the first oxide layer pattern to fill the remaining portion of the first trench.

Accordingly, since the device isolation structure between a through electrode structure in the via hole and the circuit pattern has a cross-sectional structure of O—N—O, the space occupied by the oxide may be reduced/minimized. Thus, the stress of the through electrode influencing on a circuit element due to shrinkage of the oxides during a manufacturing process may be reduced to thereby reduce device influences (for example, a measure of a change in current, for example ΔIon).

Alternatively or additionally, the semiconductor device may include a dummy isolation structure provided in a second trench extending in one direction in a buffer region between the via hole and the circuit pattern. The dummy isolation structure may include a second oxide layer pattern provided on an inner surface of the second trench and a second nitride layer pattern on the second oxide layer pattern to fill the remaining portion of the second trench.

Accordingly, since the dummy separation structure in the buffer region has a cross-sectional structure of O—N—O, the space occupied by the oxide may be reduced/minimized. Thus, the stress of the through electrode influencing on the circuit element due to shrinkage of the oxides during the manufacturing process may be reduced to thereby reduce device influences (for example, fluctuation value ΔIon of the operation current).

BRIEF DESCRIPTION OF THE DRAWINGS

Some example embodiments will be more clearly understood from the following detailed description taken in conjunction with the accompanying drawings.

FIG. 1 is a cross-sectional view illustrating a semiconductor device in accordance with some example embodiments.

FIG. 2 is a plan view illustrating a substrate of the semiconductor device in FIG. 1.

FIGS. 3 to 14 are cross-sectional views illustrating a method of manufacturing a semiconductor package in accordance with some example embodiments.

FIG. 15 is a plan view illustrating a substrate of a semiconductor device in accordance with some example embodiments.

FIG. 16 is a cross-sectional view illustrating a semiconductor device in accordance with some example embodiments.

FIG. 17 is a plan view illustrating a substrate of the semiconductor device in FIG. 16.

FIG. 18 is a cross-sectional view illustrating a semiconductor device in accordance with some example embodiments.

FIG. 19 is a plan view illustrating a substrate of the semiconductor device in FIG. 18.

FIG. 20 is a cross-sectional view illustrating a semiconductor device in accordance with some example embodiments.

FIG. 21 is a plan view illustrating a substrate of the semiconductor device in FIG. 20.

FIG. 22 is a cross-sectional view illustrating a semiconductor package in accordance with some example embodiments.

FIG. 23 is an enlarged cross-sectional view illustrating portion 'A' in FIG. 22.

DETAILED DESCRIPTION OF SOME EXAMPLE EMBODIMENTS

Hereinafter, some example embodiments will be explained in detail with reference to the accompanying drawings.

Figure 1:
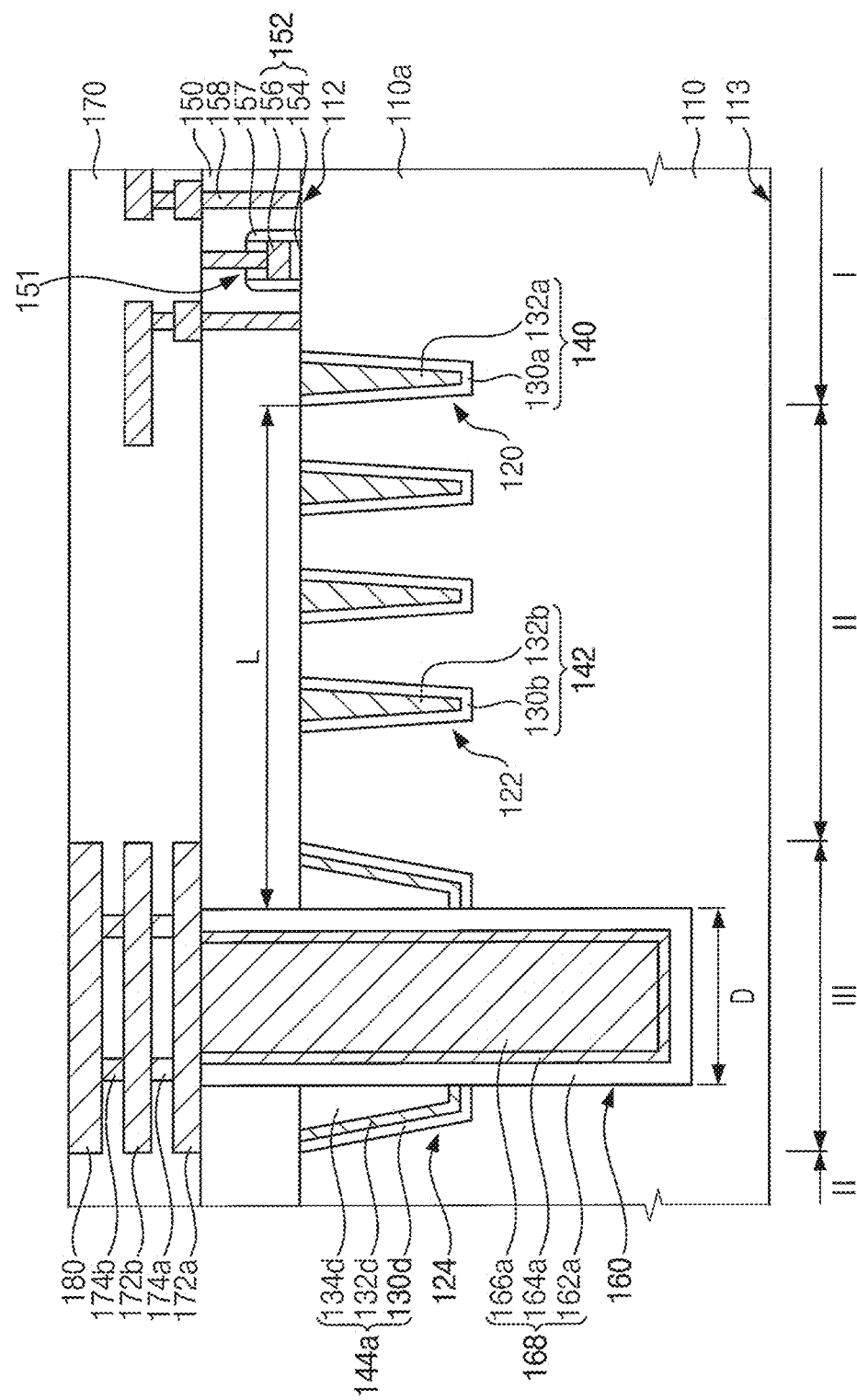
FIGS. 1 to 23 represent non-limiting, some example embodiments as described herein.
Figure 2:
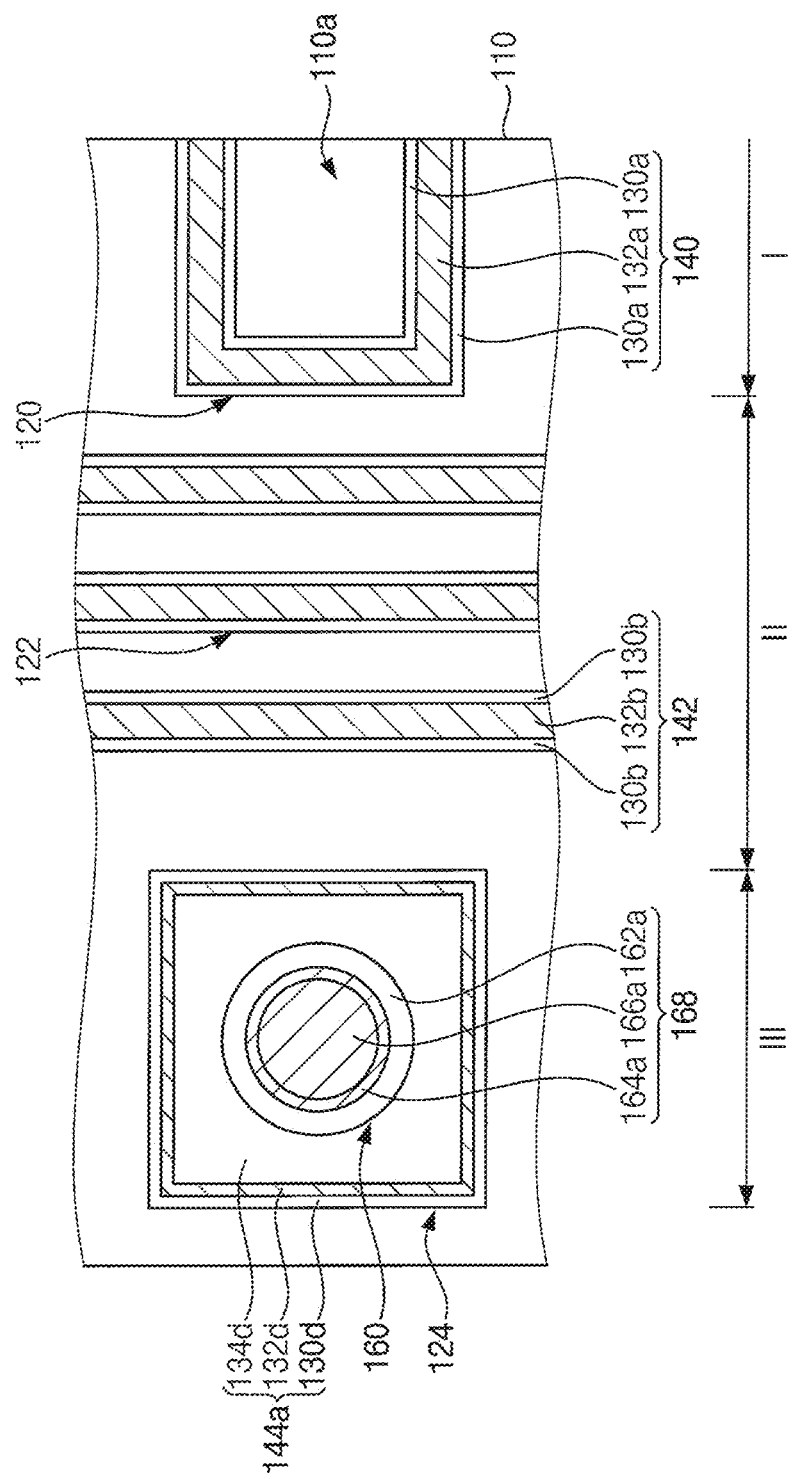

FIG. 1 is a cross-sectional view illustrating a semiconductor device in accordance with some example embodiments. FIG. 2 is a plan view illustrating a substrate of the semiconductor device in FIG. 1.

Referring to FIGS. 1 and 2, a semiconductor device may include isolation structures 140, 142, 144a provided in a surface of a substrate 110, a circuit pattern 151 provided on the substrate 110, an insulation interlayer 150 and a through electrode structure 168. The semiconductor device may further include an upper wiring layer 170.

In some example embodiments, the substrate 110 may be a semiconductor substrate such as a single crystalline silicon substrate, single crystalline germanium substrate, a silicon-germanium substrate, a silicon-on-insulator (SOI) substrate, a germanium-on-insulator (GOI) substrate, etc.

The substrate 110 may have a first surface 112 and a second surface 113 opposite to each other. For example, the first surface 112 may be or correspond to an active surface, and the second surface 113 may be or correspond to a non-active surface.

The isolation structures 140, 142, 144a may be formed in an upper portion of the substrate 110 adjacent to the first surface 112. In some example embodiments, the substrate 110 may be divided into a first region (I), a second region (II), and a third region (III) by the isolation structures 140, 142, and 144a.

The first region I may be or include a circuit region in which a circuit element of the semiconductor device is formed, and the third region III may be or include a via region in which the through electrode structure is formed. The second region II may be or correspond to a buffer region for relieving stress, such as tensile and/or compressive stress, transmitted between/associated with the first region I and the third region III. The second region II may be provided to relieve thermal and/or mechanical stress generated from a through electrode 166a, for example, caused by a difference in coefficient of thermal expansion (CTE). For example, the circuit element may not be formed on or in the second region II, and the second region II may be provided as a keep-out zone (KOZ).

In some example embodiments, the first isolation structure 140 formed in the first region I as a device isolation structure may provide an active region 110a. The second isolation structures 142 formed in the second region II may be or include or correspond to dummy isolation structures and may improve a quality of a planarization process (such as a planarization process described below). The third isolation structure 144a formed in the third region III may be or include or correspond to a via isolation structure and may relieve and/or absorb stress generated from the through electrode structure.

A first trench 120 defining the first region I may be formed in the first surface 112 of the substrate 110, and second trenches 122 and a third trench 124 defining the third region III may be formed in the second region II.

A first portion of the first trench 120 may extend in a first direction. In addition, a second portion of the first trench 120 may extend from the first portion in a second direction perpendicular to the first direction to define the first region I. The second trenches 122 may extend in the first direction. The third trench 124 may have an isolated shape to define the third region III. For example, the third trench 124 may have a rectangular shape.

The first trench 120 may have a first width W1, the second trench 122 may have a second width W2 equal to or less than the first width W1, and the third trench 124 may have a third width W3 greater than the first and second widths W1, W2 (refer below to, e.g., FIG. 4).

The first isolation structure 140 may include a first oxide layer pattern 130a provided on an inner surface of the first trench 120 and a first nitride layer pattern 132a on the first oxide layer pattern 130a to fill the remaining portion of the first trench 120.

The second isolation structure 142 may include a second oxide layer pattern 130b provided on an inner surface of the second trench 122 and a second nitride layer pattern 132b on the second oxide layer pattern 130b to fill the remaining portion of the second trench 122.

The third isolation structure 144a may include a third oxide layer pattern 130d provided on an inner surface of the third trench 124, a third nitride layer pattern 132d on the third oxide layer pattern 132d and a fourth oxide layer pattern 134d on the third nitride layer pattern 132d to fill the remaining portion of the third trench 124.

The first, second, third and fourth oxide layer patterns 130a, 130b, 130d, 134d may include or consist of silicon oxide. The first, second and third nitride layer patterns 132a, 132b, 132d may include or consist of silicon nitride. As another example, instead of the first, second and third nitride layer patterns, silicon layer patterns, metal layer patterns, carbon layer layers, etc. having gap filling characteristics may be provided.

Accordingly, the first isolation structure 140 disposed between the through electrode structure 168 and the circuit pattern 151 may have a cross-sectional structure of oxide-nitride-oxide (O—N—O). The second isolation structure 142 disposed in the buffer region II may have a cross-sectional structure of O—N—O. The third isolation structure 144a disposed in the via region III may have a cross-sectional structure of O—N—O—N—O.

In some example embodiments, the circuit pattern 151 may be formed on the first surface 112 of the substrate 110 of the first region I defined by the first isolation structure 140. For example, the circuit pattern may include at least one transistor and/or at least one resistor and/or at least one capacitor.

In particular, the transistor includes a gate structure 152 including a gate insulation layer pattern 154 and a gate electrode 156 sequentially stacked on the active pattern 110a of the substrate 110 and an impurity region (not illustrated) formed in an upper portion of the substrate 110 adjacent to the gate structure 152. A gate spacer 157 may be further formed on a sidewall of the gate structure 152. gast the first isolation structure 140

The gate insulation layer pattern 154 may include silicon oxide and/or metal oxide. The gate electrode 156 may include at least one of polysilicon such as doped polysilicon, metal, metal nitride, metal silicide, and/or metal silicide nitride. The gate spacer 157 may include silicon nitride.

In some example embodiments, electronic devices such as at least one of a diode, a capacitor, a resistor and an inductor may be formed on the first region I of the substrate 110 as the circuit pattern.

In some example embodiments, the insulation interlayer 150 may be formed on the substrate 110 to cover the circuit pattern. The insulation interlayer 150 may include or consist of a silicon oxide-based material such as Plasma Enhanced Oxide (PEOX), TetraEthyl OrthoSilicate (TEOS), Boro Silicate Glass (BSG), Phospho Silicate Glass (PSG), Boro Phospho Silicate Glass: BPSG), etc.

A contact plug 158 may penetrate through the insulation interlayer 150 to be electrically connected to the circuit pattern. For example, the contact plug 158 may contact the impurity region. In some example embodiments, the contact plug 158 may also contact the gate electrode 156. In some example embodiments, the contact plug 158 may include or consist of tungsten (W).

In some example embodiments, the through electrode structure 168 may penetrate at least a portion of the substrate 110 in the third region III. In addition, the through electrode structure 168 may penetrate the insulation interlayer 150.

Specifically, a via hole 160 may be formed to penetrate through the insulation interlayer 150, the third isolation structure 144a on the third region III of the substrate 110 and at least a portion of the substrate 110. For example, the via hole 160 may have a diameter D in a range of 1 μm to 15 μm. The through electrode structure 168 may include a via insulation layer pattern 162a, a barrier layer pattern 164a and a through electrode 166a sequentially stacked on an inner wall of the via hole 160.

The via insulation layer pattern 162a and the barrier layer pattern 164a may be formed conformally on the inner wall of the via hole 160 and may have a substantially cup shape. The through electrode 166a may have a tapered or cylindrical or polygonal column shape formed on the barrier layer pattern 164a.

The through electrode 166a may be or include a metal. For example, the through electrode 166a may include copper (Cu).

In some example embodiments, the upper wiring layer 170 may include a plurality of wirings provided on the insulation interlayer 150.

The upper wiring layer 170 may include a plurality of buffer layers and insulation layers alternately stacked. For example, the buffer layer may include silicon nitride, silicon carbon nitride, SiCON, etc. The insulation layer may be or include silicon oxide, carbon-doped silicon oxide, silicon carbonitride (SiCN), etc.

The upper wiring layer 170 may include a plurality of wirings therein. For example, the wiring may include a first metal wiring 172a, a first contact 174a, a second metal wiring 172b, and a second contact 174b. A bonding pad 180 may be provided on the outermost insulation layer of the upper wiring layer 170. The bonding pad 180 may be exposed from the outermost insulating layer of the upper wiring layer 170.

Accordingly, the through electrode structure 168 may be electrically connected to the bonding pad 180 by the wirings. The circuit pattern 151 may be electrically connected to the bonding pad 180 by the contact plug 158 and the wirings.

For example, the first trench 120 may be spaced apart from the via hole 160 by a distance L of 5 μm to 15 μm. The via hole 160 may have the diameter D in the range of 1 μm to 15 μm. The first and second widths W1 and W2 of the first and second trenches 120, 122 may be within a range of 40 nm to 80 nm. A ratio (D/W1) of the diameter D of the via hole 160 to the width W1 of the first trench 120 may be within a range of 50 to 150.

As mentioned above, the semiconductor device may include the device isolation structure 140 provided in the first trench 120 extending in one direction in the first surface 112 of the substrate 110 between the via hole 160 and the circuit pattern 151. The device isolation structure 140 may include the first oxide layer pattern 130a on the inner surface of the first trench 120 and the first nitride layer pattern 132a on the first oxide layer pattern 130a to fill the remaining portion of the first trench 120.

Accordingly, since the device isolation structure 140 between the through electrode structure 168 in the via hole 160 and the circuit pattern 151 has a cross-sectional structure of O—N—O, the space occupied by the oxide may be reduced/minimized. Thus, the stress such as tensile and/or compressive stress of the through electrode influencing on the circuit element due to shrinkage of the oxides during a manufacturing process may be reduced to thereby reduce device influences (for example, ΔIon).

Alternatively or additionally, the semiconductor device may include the dummy isolation structure 142 provided in the second trench 122 extending in one direction in the buffer region II between the via hole 160 and the circuit pattern 151. The dummy isolation structure 142 may include the second oxide layer pattern 130b provided on the inner surface of the second trench 122 and the second nitride layer pattern 130b on the second oxide layer pattern 130b to fill the remaining portion of the second trench 122.

Accordingly, since the dummy separation structure 142 in the buffer region II has a cross-sectional structure of O—N—O, the space occupied by the oxide may be reduced/minimized. Thus, the stress, e.g. the tensile and/or compressive stress, of the through electrode influencing on the circuit element due to shrinkage of the oxides during the manufacturing process may be reduced to thereby reduce device influences (for example, fluctuation value ΔIon of the operation current).

Hereinafter, a method of manufacturing/fabricating the semiconductor device in FIG. 1 will be explained.

Figure 6:
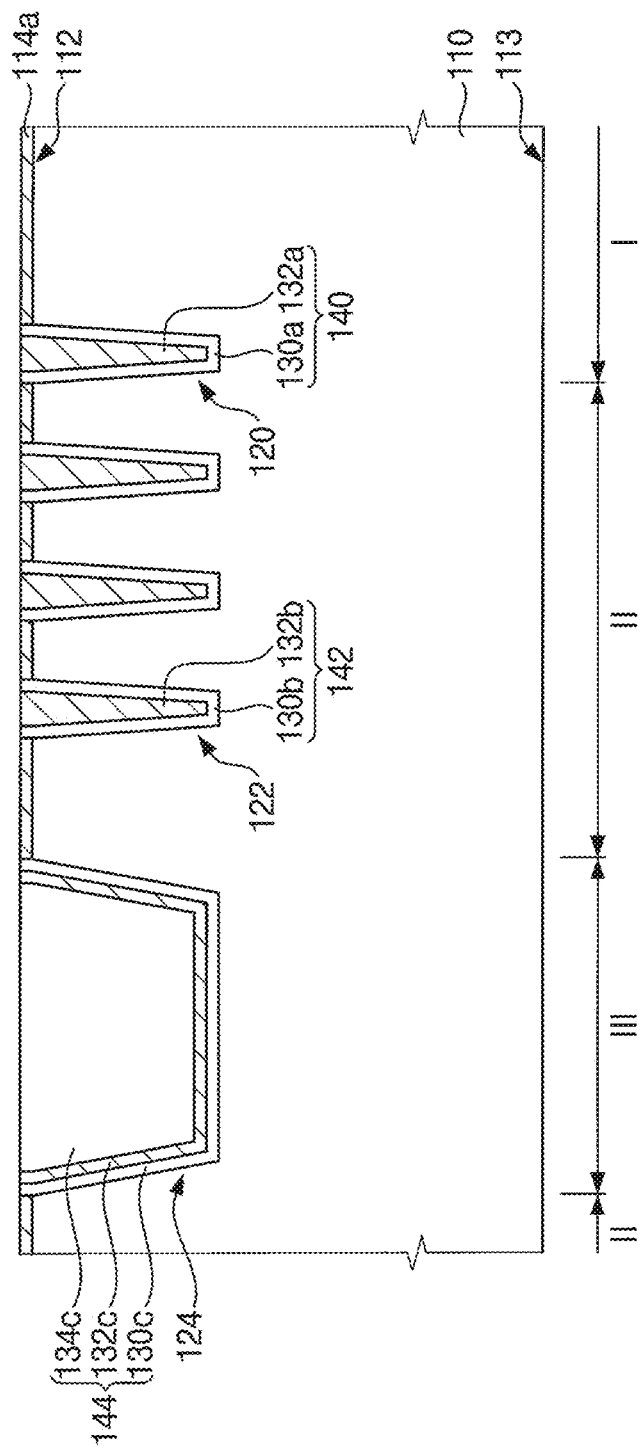
Figure 7:
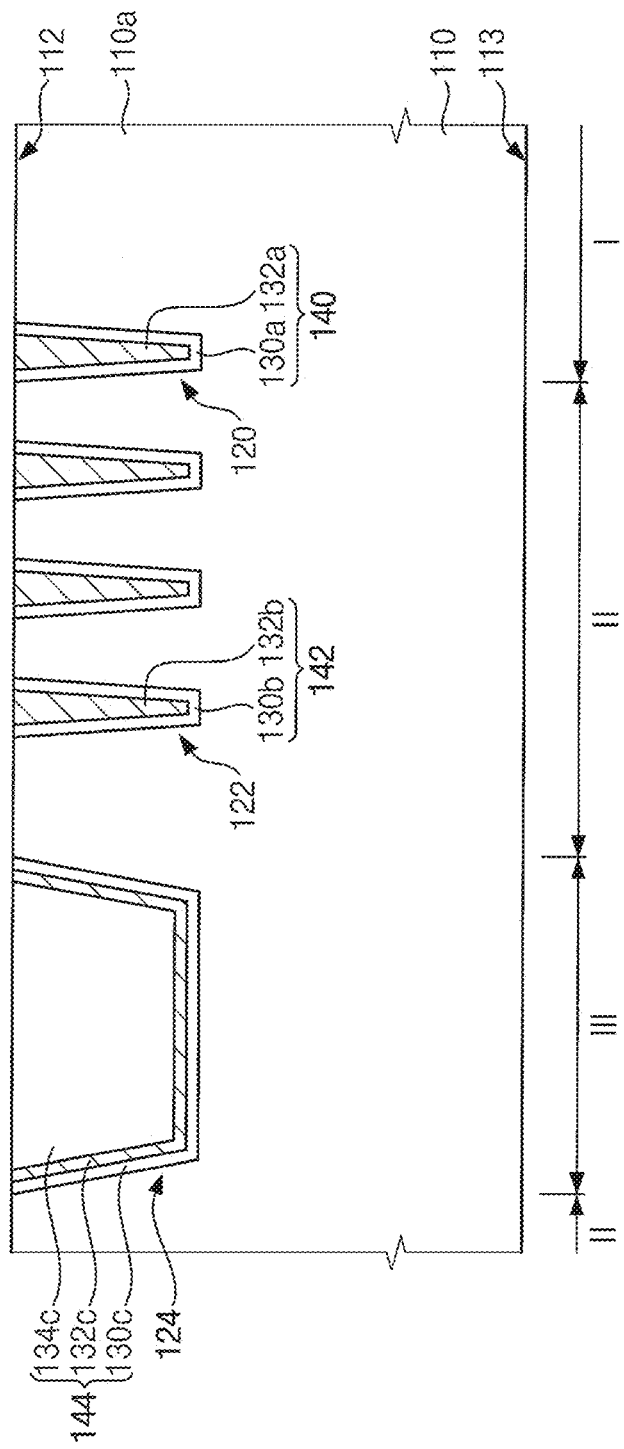
Figure 8:
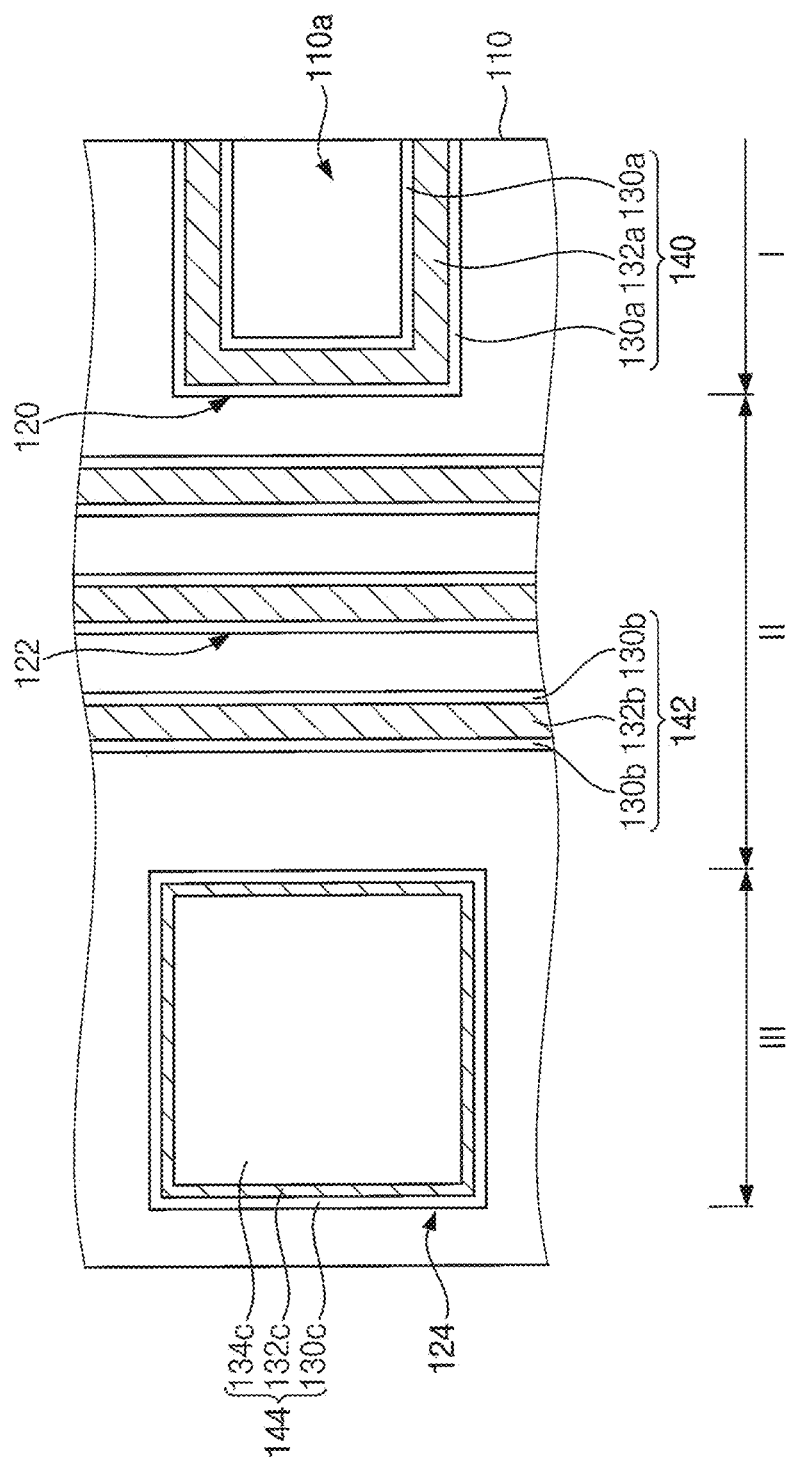

FIGS. 3 to 14 are cross-sectional views illustrating a method of manufacturing a semiconductor package in accordance with some example embodiments. FIGS. 3 to 7 and 9 to 14 are cross-sectional views, and FIG. 8 is a plan view illustrating a substrate in FIG. 7.

Referring to FIGS. 3 to 8, a first isolation structure 140, a second isolation structure 142 and a third isolation structure 144 may be formed in a first region I, a second region II and a third region III of a substrate 110, respectively.

In some example embodiments, the first to third isolation structures 140, 142, 144 may be formed by performing a shallow trench isolation (STI) process on an upper portion of the substrate 110.

Figure 3:
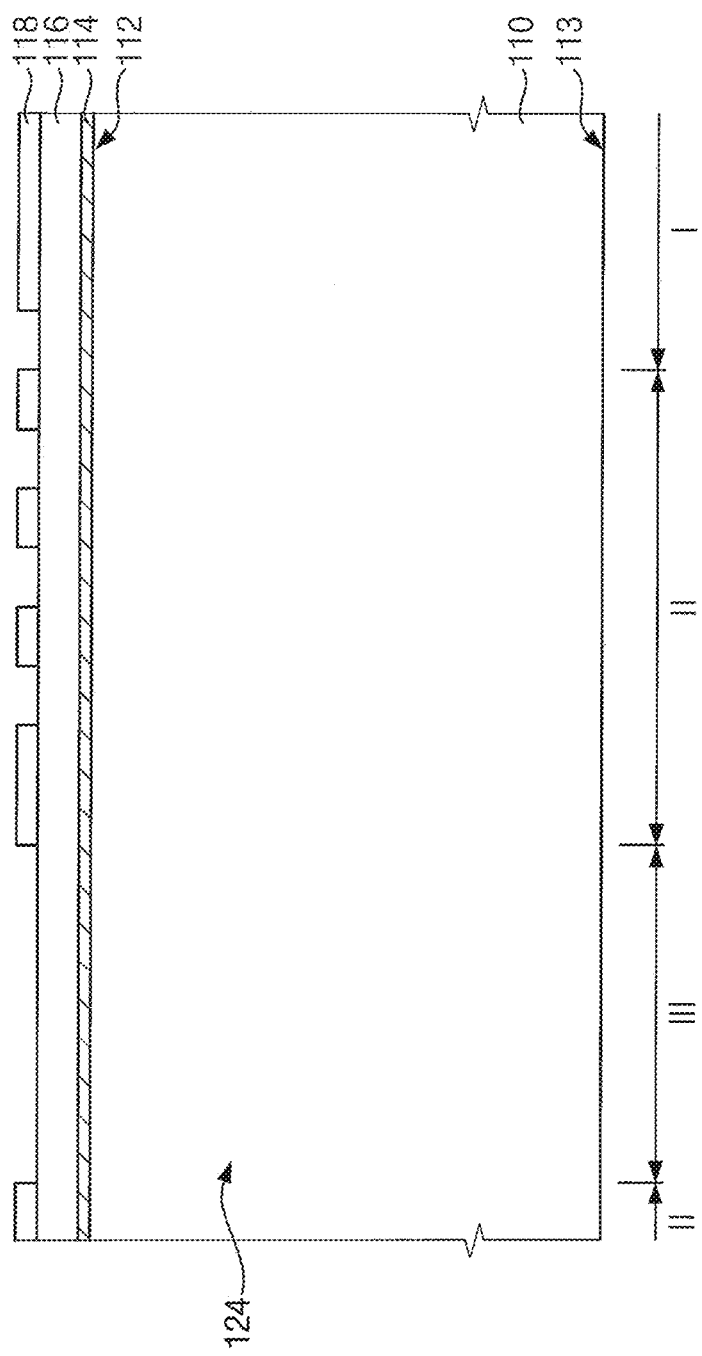

As illustrated in FIG. 3, a blocking layer 114, a hard mask layer 116, and a mask pattern 118 may be formed on a first surface 112 of the substrate 110.

Although it is not illustrated in the figures, a pad insulation layer may be formed on the first surface 112 of the substrate 110. The pad insulation layer may be or include, for example, silicon oxide. The pad insulation layer may be formed through, for example, at least one of an atomic layer deposition process, a thermal oxidation process, or a chemical vapor deposition process.

The blocking layer 114 may be or include, for example, silicon nitride. The blocking layer 114 may be formed through, for example, an atomic layer deposition process and/or a chemical vapor deposition method. The blocking layer 114 may be used as a polishing stop layer and/or an etch stop layer in a process of planarizing silicon oxide e.g. planarizing with a chemical mechanical planarization (CMP) process and/or an etch back process.

The hard mask layer 116 may be or include, for example, silicon oxide. The hard mask layer 116 may be formed by, for example, an atomic layer deposition process and/or a chemical vapor deposition process. The hard mask layer 116 may be provided as an etching mask (e.g. a dry and/or wet etching mask) for etching the substrate.

The mask pattern 118 may have a shape covering regions where active patterns are formed. The mask pattern 118 may include a photoresist pattern formed through a photo process. Alternatively or additionally, the mask pattern may be formed using a dual patterning technology (DPT) and/or a quadruple patterning technology (QPT).

Figure 4:
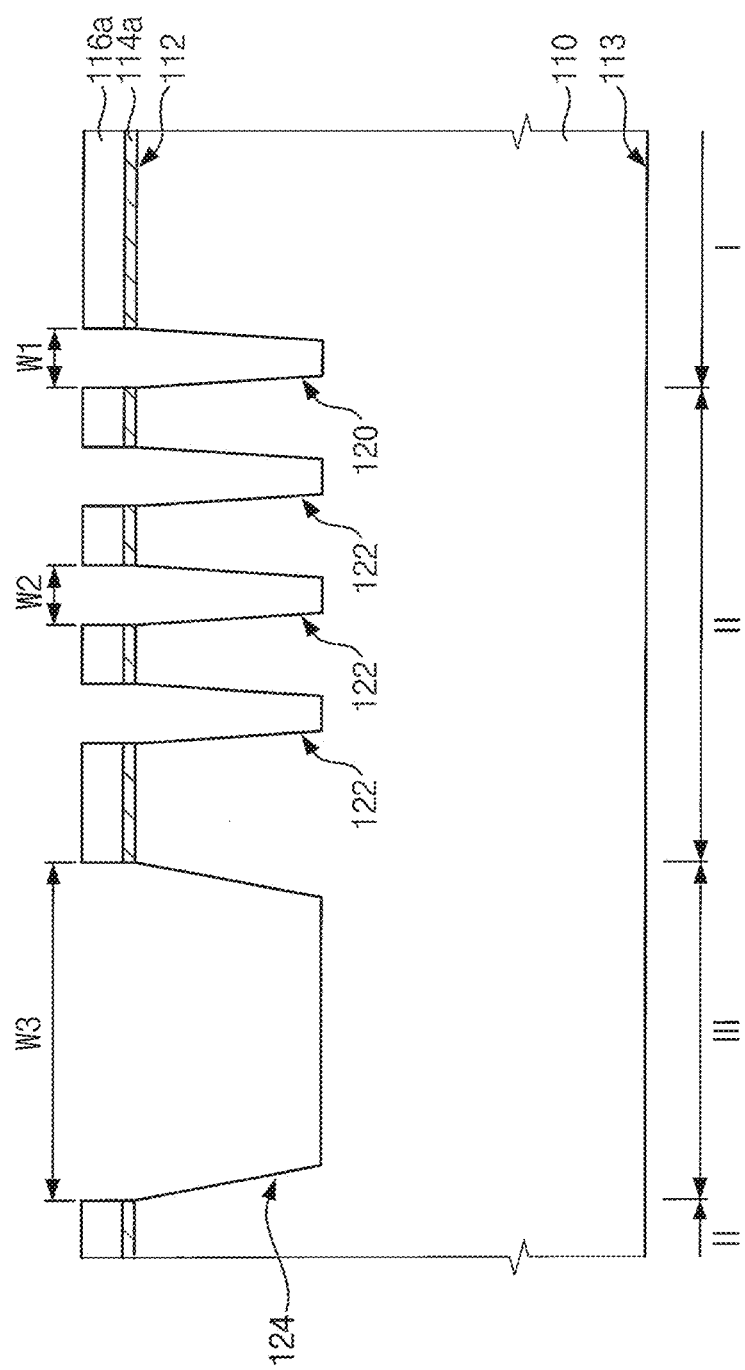

As illustrated in FIG. 4, the hard mask layer 116, the blocking layer 114 and the pad insulation layer may be sequentially etched using the mask pattern 118 to form a pad insulation layer pattern, a blocking layer pattern 114a and a hard mask 116a. Then, the substrate 110 may be etched using the hard mask 116a as an etching mask to form an active pattern 110a. Additionally, a first trench 120 defining the first region I may be formed, second trenches 122 may be formed in the second region II, and a third trench 24 defining the third region III may be formed. The etching process may include an isotropic etch process.

A first portion of the first trench 120 may extend in a first direction. In addition, a second portion of the first trench 120 may extend from the first portion in a second direction perpendicular to the first direction to define the first region I. The second trenches 122 may extend in the first direction. The third trench 124 may have an isolated shape to define the third region III. For example, the third trench 124 may have a rectangular shape.

The first trench 120 may have the first width W1, the second trench 122 may have the second width W2 equal to or less than the first width W1, and the third trench 124 may have the third width W3 greater than the first and second widths W1, W2.

Figure 5:
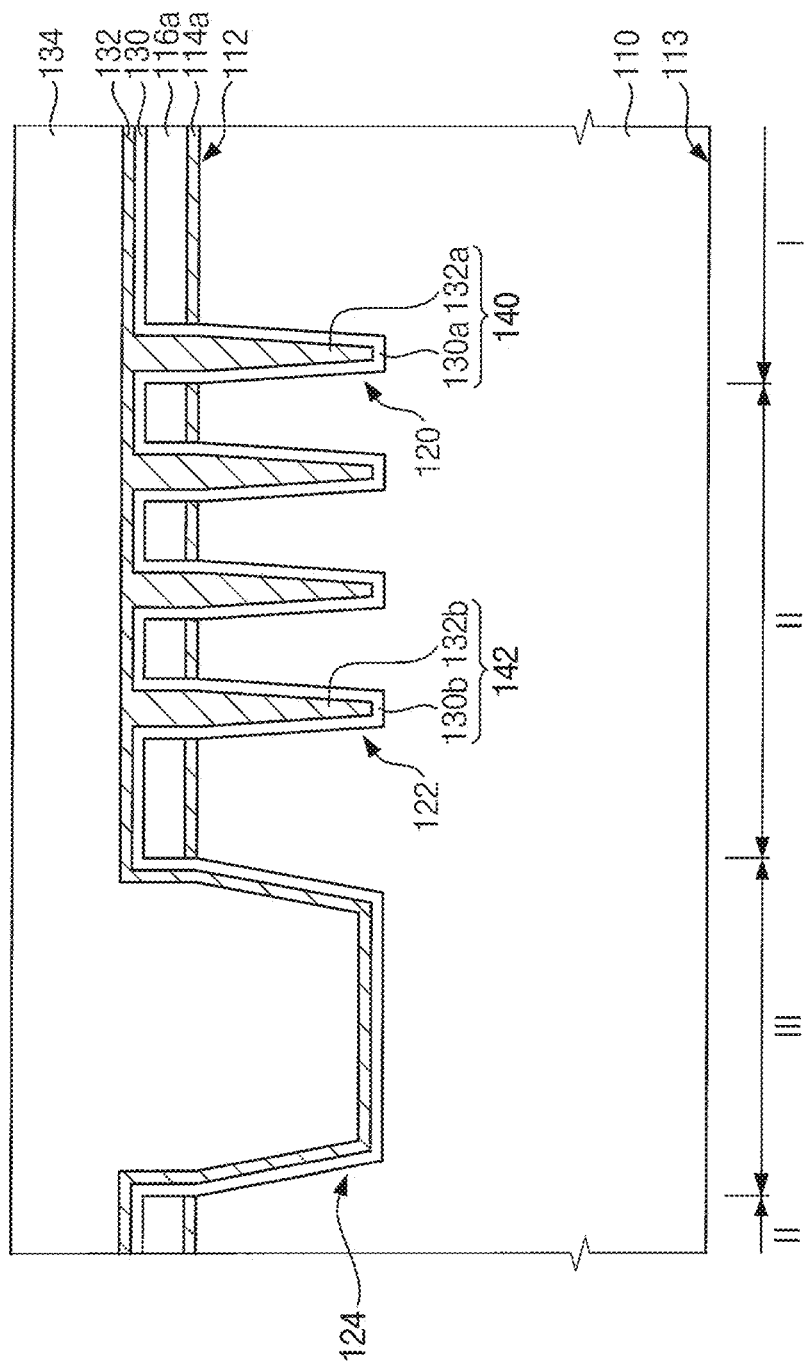

As illustrated in FIG. 5, a first oxide layer 130, a first nitride layer 132 and a second oxide layer 134 may be formed on sidewalls and bottom surfaces of the first to third trenches 120, 122, 124 and on the hard mask 116a.

The first oxide layer 130 may be formed conformally along the sidewalls and the bottom surfaces of the first, second and third trenches 120, 122, 124. Accordingly, the first oxide layer 130 may not completely fill the inside of the first, second, and third trenches 120, 122, and 124.

The first nitride layer 132 may be formed on the first oxide layer 130 to completely fill the first and second trenches 120 and 122. The first nitride layer 132 may be formed conformally on the first oxide layer 130 along the sidewalls and a bottom surface of the third trench 124. Accordingly, the first nitride layer 132 may not completely fill the inside of the third trench 124.

The second oxide layer 134 may be formed on the first nitride layer 132 to completely fill the third trench 124.

The first and second oxide layers 130, 134 may be or include silicon oxide. The first nitride layer 132 may be or include silicon nitride. For example, the first and second oxide layers and the first nitride layer may be formed by a chemical vapor deposition process and/or an atomic layer deposition process. Alternatively or additionally, at least one of the first and second oxide layers 130, 134 may be formed with an in-situ steam generation (ISSG) process. As another example, instead of the first nitride layer, a silicon layer, a metal layer, a carbon layer, etc. having gap filling characteristics may be formed on the first oxide layer.

As illustrated in FIG. 6, the second oxide layer 134, the first nitride layer 132, the first oxide layer 130, and the hard mask 116a may be planarized e.g. with a CMP process so that an upper surface of the blocking layer pattern 104a is exposed. Through the above process, the first isolation structure 140 including a first oxide layer pattern 130a and a first nitride layer pattern 132a may be formed in the first trench 120. The second isolation structure 142 including a second oxide layer pattern 130b and a second nitride layer pattern 132b may be formed in the second trench 122, and the third isolation structure 144 including a third oxide layer pattern 130c, a third nitride layer pattern 132c and a fourth oxide layer pattern 134c may be formed in the third trench 124.

The planarization process may include a chemical mechanical polishing process and/or an etch back process. In some example embodiments, a blocking layer pattern 114a may be provided as a polishing stop layer and/or an etch stop layer, and may have a polish selectivity and/or an etch selectivity with respect to the second oxide layer 134. Dishing of the fourth oxide layer pattern 134c may be improved and/or mitigated, e.g. based on slurries used in a CMP process.

As illustrated in FIGS. 7 and 8, the blocking layer pattern 114a may be removed. The blocking layer pattern 114a may be removed through, for example, an isotropic etch process such as a wet etch process.

The pad insulation layer pattern may be removed to expose the first surface 112 of the substrate 110 including an upper surface of the active pattern 110a. Alternatively or additionally, in the process of removing the pad insulation layer pattern, upper surfaces of the first to fourth oxide layer patterns 130a, 130b, 130c, 134c and the first to third nitride layer patterns 132a, 132b, 132c may be partially removed by a certain thickness.

The substrate 110 may be divided into the first region I, the second region II, and the third region III by the first to third isolation structures 140, 142, 144. As described later, the first region I defined by the first isolation structure 140 may be provided as a circuit region. The third region III defined by the third isolation structure 144 may be provided as a via region in which a through electrode structure is to be formed. The second region II may be provided as a buffer region, e.g. as a keep-out zone (KOZ) between the first region I and the third region III.

In addition, the first isolation structure 140 formed in the first region I as a device isolation structure may provide the active region 110a. The second isolation structures 142 formed in the second region II may be dummy isolation structures and may improve a quality of the planarization process. The third isolation structure 144 formed in the third region III may be or correspond to a via isolation structure and may relieve or absorb stress generated from the through electrode structure.

Figure 9:
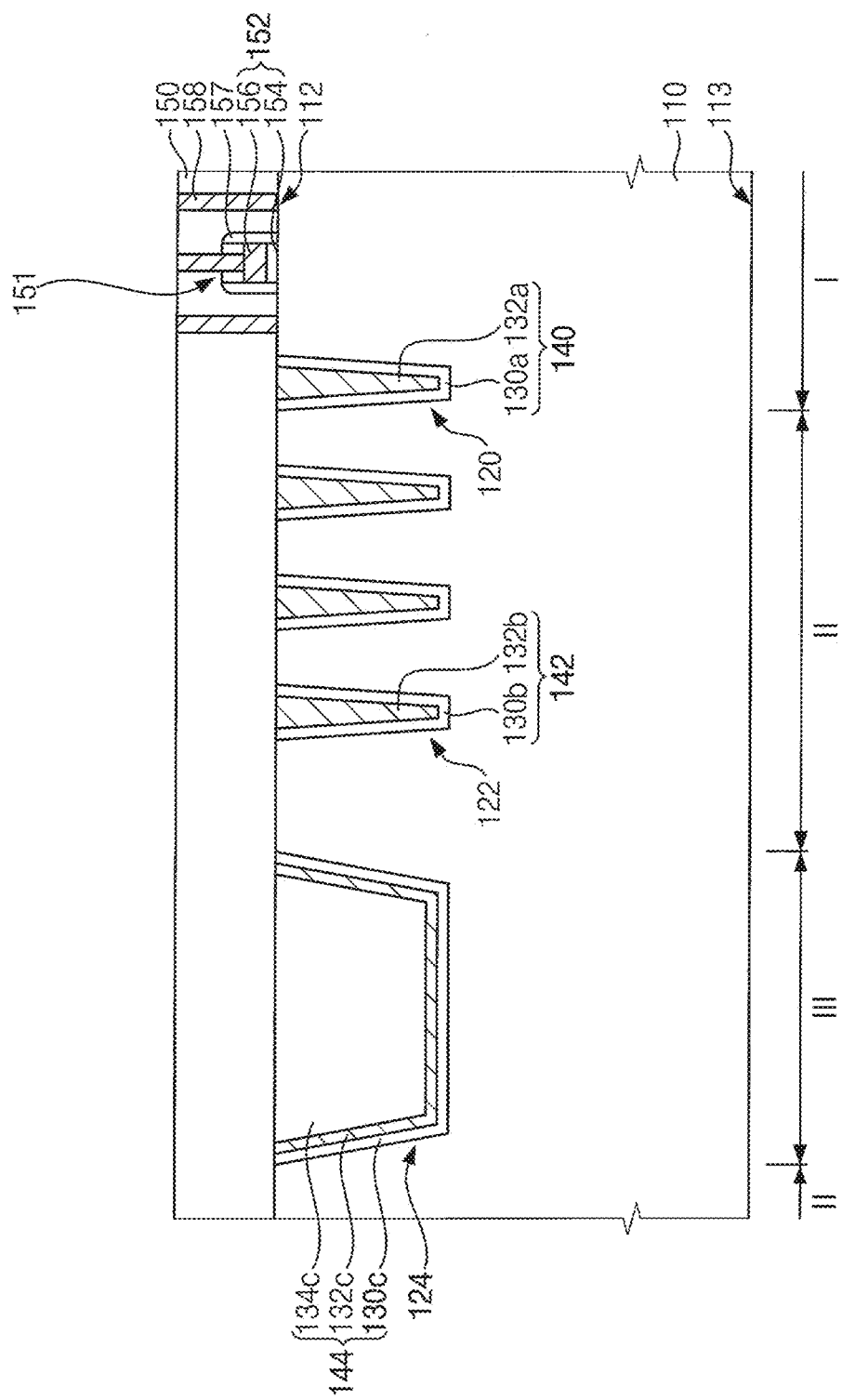

Referring to FIG. 9, a circuit pattern 151 may be formed on the first region I of the substrate 110, and an insulation interlayer 150 may be formed to cover the circuit pattern 151.

In some example embodiments, the circuit pattern may be formed on the first surface 112 of the substrate 110 of the first region (I) by performing a front end of line (FEOL) process. For example, the circuit pattern may include at least one of a transistor, a diode, or a resistor. The transistor may be a planar transistor or a FinFET transistor.

In particular, a gate structure 151 may be formed on the active pattern 110a and the first isolation structure 140. For example, a gate insulation layer and a gate electrode layer may be sequentially formed on the substrate 110 and the first isolation structure 140. The gate insulation layer and the gate electrode layer may be patterned through, for example, a photolithography process to form a gate insulating layer pattern 154 and a gate electrode 156 sequentially stacked on the first region I of the substrate 110. Thus, a gate structure 152 including the gate insulating layer pattern 154 and the gate electrode 156 may be defined.

The gate insulation layer may be formed using an oxide-based material such as silicon oxide and/or metal oxide. The gate insulation layer may be formed through, for example, a chemical vapor deposition (CVD) process, a plasma enhanced chemical vapor deposition (PECVD) process, a low pressure chemical vapor deposition (LPCVD) process, a spin coating process, etc. In some example embodiments, the gate insulation layer may be formed by performing a thermal oxidation process on the first surface 112 of the substrate 110.

The gate electrode layer may be formed of at least one of doped polysilicon, metal, metal nitride, metal silicide, and/or metal silicide nitride. For example, the gate electrode layer may be formed through at least one of a physical vapor deposition (PVD) process, a sputtering process, an atomic layer deposition (ALD) process, etc.

In some example embodiment, a spacer layer may be formed on the substrate 110 and the first separation structure 140 to cover the gate structure 152, and the spacer layer may be etched through, for example, an anisotropic etching process (such as a dry etching process) to form a gate spacer 157 on a sidewall of the gate structure 150. The spacer layer may be formed of, for example, a nitride-based material such as silicon nitride.

An impurity such as at least one of boron, phosphorous, or arsenic may be implanted/doped onto/into the substrate 110 adjacent to the gate structure 152 through an ion implantation process to form an impurity region (not illustrated). Accordingly, a transistor including the gate structure 150 and the impurity region may be formed on the first region I of the substrate 110. The impurity region may function as a source/drain region of the transistor.

Although only one transistor is illustrated in FIG. 9, a plurality of transistors may be formed on the first region I of the substrate 110. In addition, the transistor is an example, and various electronic devices including conductive lines such as a diode, a capacitor, a word line, and/or a bit line may be formed as a circuit element.

Then, the insulation interlayer 150 covering the circuit pattern may be formed on the substrate 110, and a contact plug 158 may be formed through the insulation interlayer 150 to contact the impurity region. In some example embodiments, the contact plug 158 may also contact the gate electrode 156.

Referring to FIGS. 10 to 13, a through electrode structure 168 penetrating the insulation interlayer 150 and at least a portion of the substrate 110 may be formed in the third region III of the substrate 110.

Figure 10:
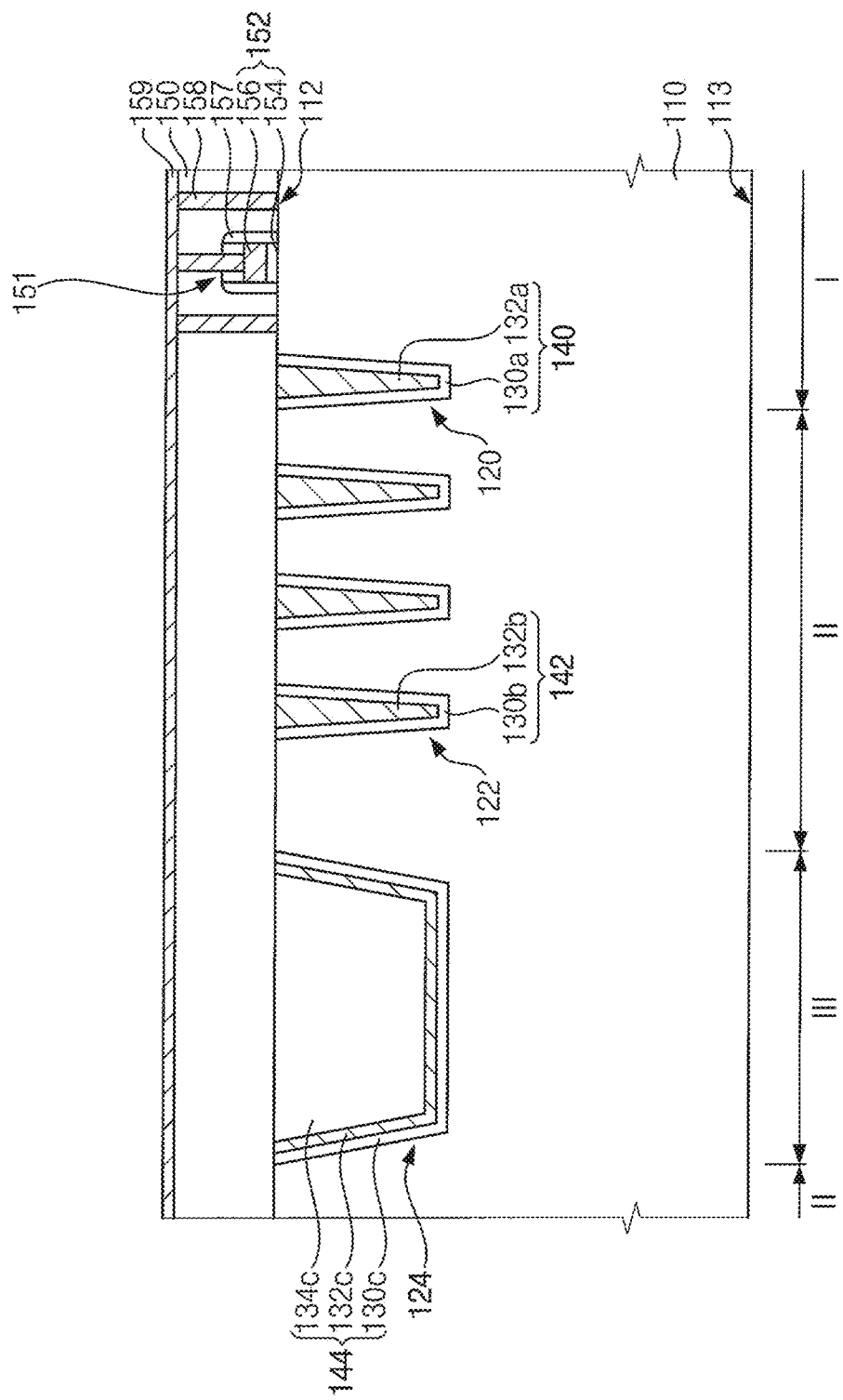
Figure 11:
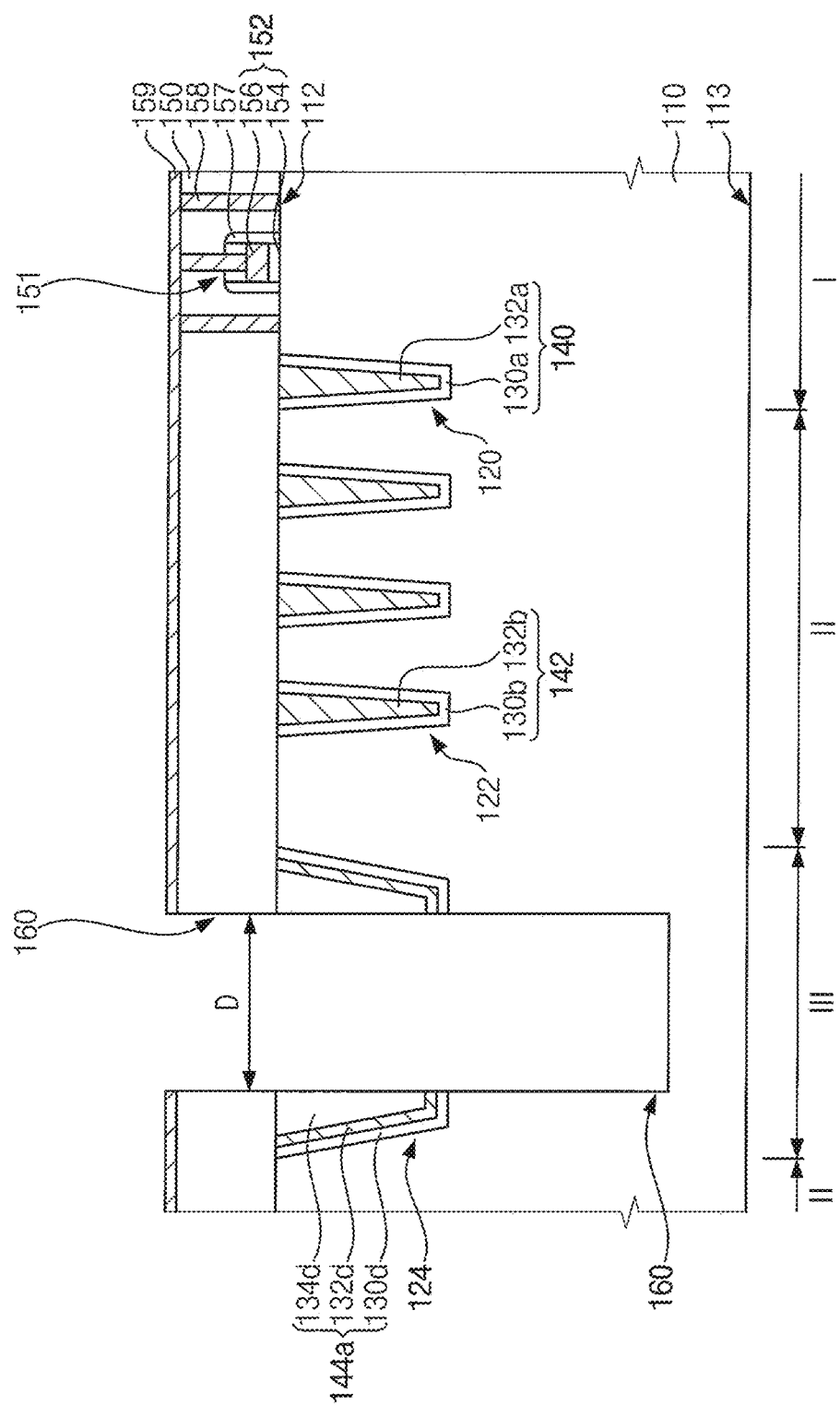

As illustrated in FIGS. 10 and 11, an etch stop layer 159 may be formed on the insulation interlayer 150 to cover the contact plug 158, and a via hole 160 may be formed to penetrate through the etch stop layer 159, the insulation interlayer 150, and the third isolation structure 144 and the substrate 110.

In some example embodiments, the etch stop layer 159 may be formed using silicon nitride and/or silicon oxynitride through, for example, a CVD process.

The via hole 160 may be formed on the third region III of the substrate 110. In some example embodiments, the via hole 160 may penetrate through portions of the etch stop layer 159, the interlayer insulating layer 150, and the third isolation structure 144 formed on the third region III, and may penetrate the portion of the substrate 110 in the third region III. For example, a bottom surface of the via hole 160 may be located between the upper and lower surfaces of the substrate 110.

For example, after forming a photoresist layer on the etch stop layer 159, a portion of the photoresist layer formed on the third region III may be removed through exposure and development processes to form a photoresist pattern (not illustrated). The etch stop layer 159 may function as an anti-reflective layer when performed in the exposure process.

The via hole 160 can be formed by sequentially etching portions of the etch stop layer 159, the insulation interlayer 150, the third isolation structure 144 and the substrate 110 using the photoresist pattern as an etching mask. For example, the via hole 160 may have a diameter D in a range of 1 μm to 15 μm. The via hole 160 may be formed with a deep reactive ion etching (DRIE) process such as a Bosch etch process; however, example embodiments are not limited thereto.

After the via hole 160 is formed, the photoresist pattern may be removed through an ashing and/or strip process.

Figure 12:
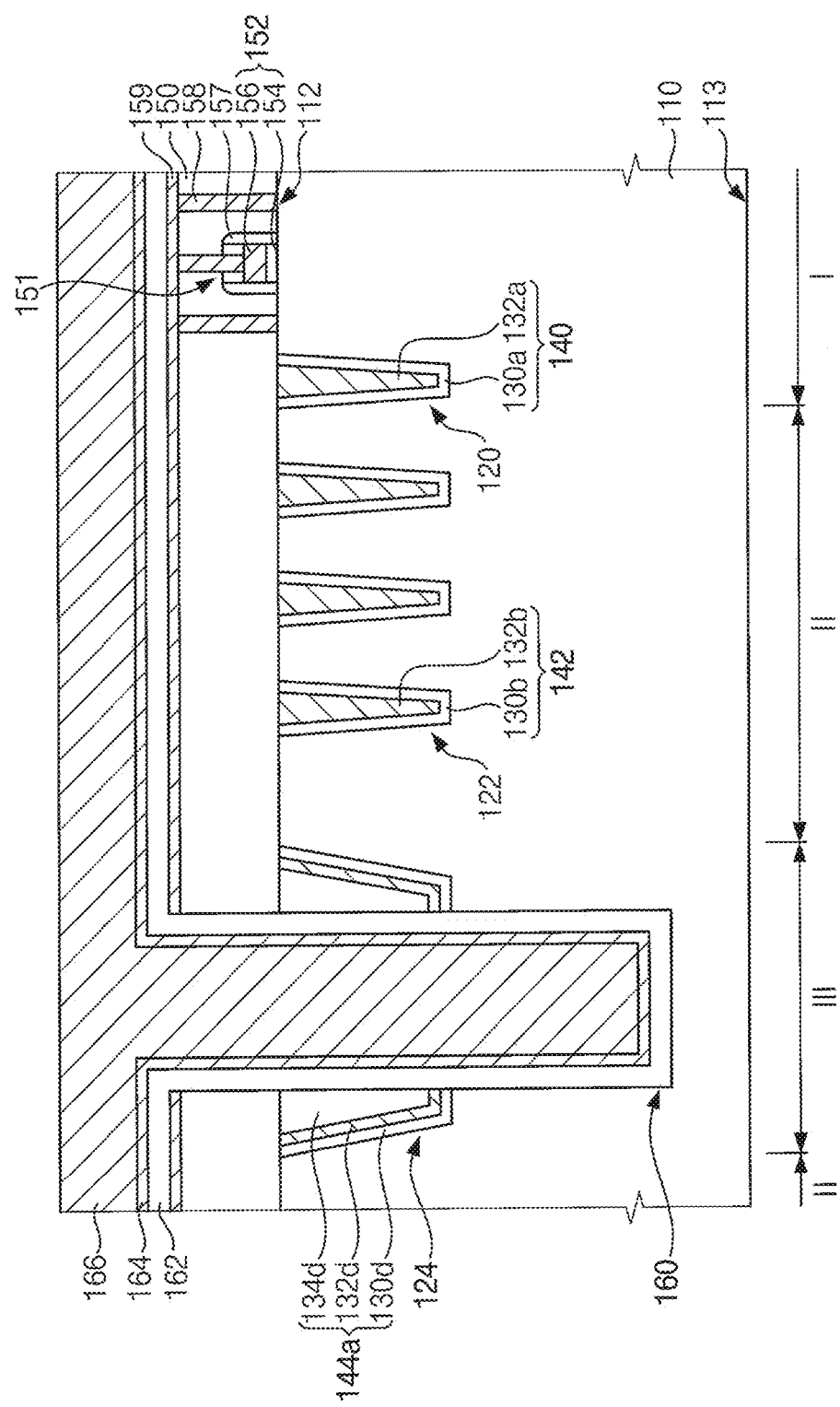

As illustrated in FIG. 12, a via insulation layer 162, a barrier layer 164 and a conductive layer 166 may be sequentially formed to fill the via hole 160.

For example, the via insulation layer 162 may be formed conformally on an upper surface of the etch stop layer 159 and an inner wall of the via hole 160. The via insulation layer 162 may be formed using a low dielectric material to suppress an occurrence of parasitic capacitance. For example, the via insulation layer 162 may be formed using at least one of porous silicon oxide, siloxane or silsesquioxane-based material, etc.

The barrier layer 164 may be formed conformally on the via insulation layer 146. The barrier layer 164 may be formed of a conductive material such as at least one of tantalum, tantalum nitride, titanium, titanium nitride, ruthenium, cobalt, nickel, nickel boride, tungsten nitride, or the like.

The conductive layer 166 may be formed on the barrier layer 164 to fill the remaining portion of the via hole 160. For example, the conductive layer 166 may be formed using a metal. The conductive layer 166 may be formed of copper having high electrical conductivity and low resistance, and may be formed with an electro-chemical deposition process; however, example embodiments are not limited thereto.

The via insulation layer 162, the barrier layer 164 and the conductive layer 166 may be formed through, for example, at least one of a CVD process, a sputtering process, a PVD process, and an ALD process. In some example embodiments, the conductive layer 166 may be formed by forming a seed layer including, for example, copper on the barrier layer 164 and performing an electroplating process using the seed layer.

Figure 13:
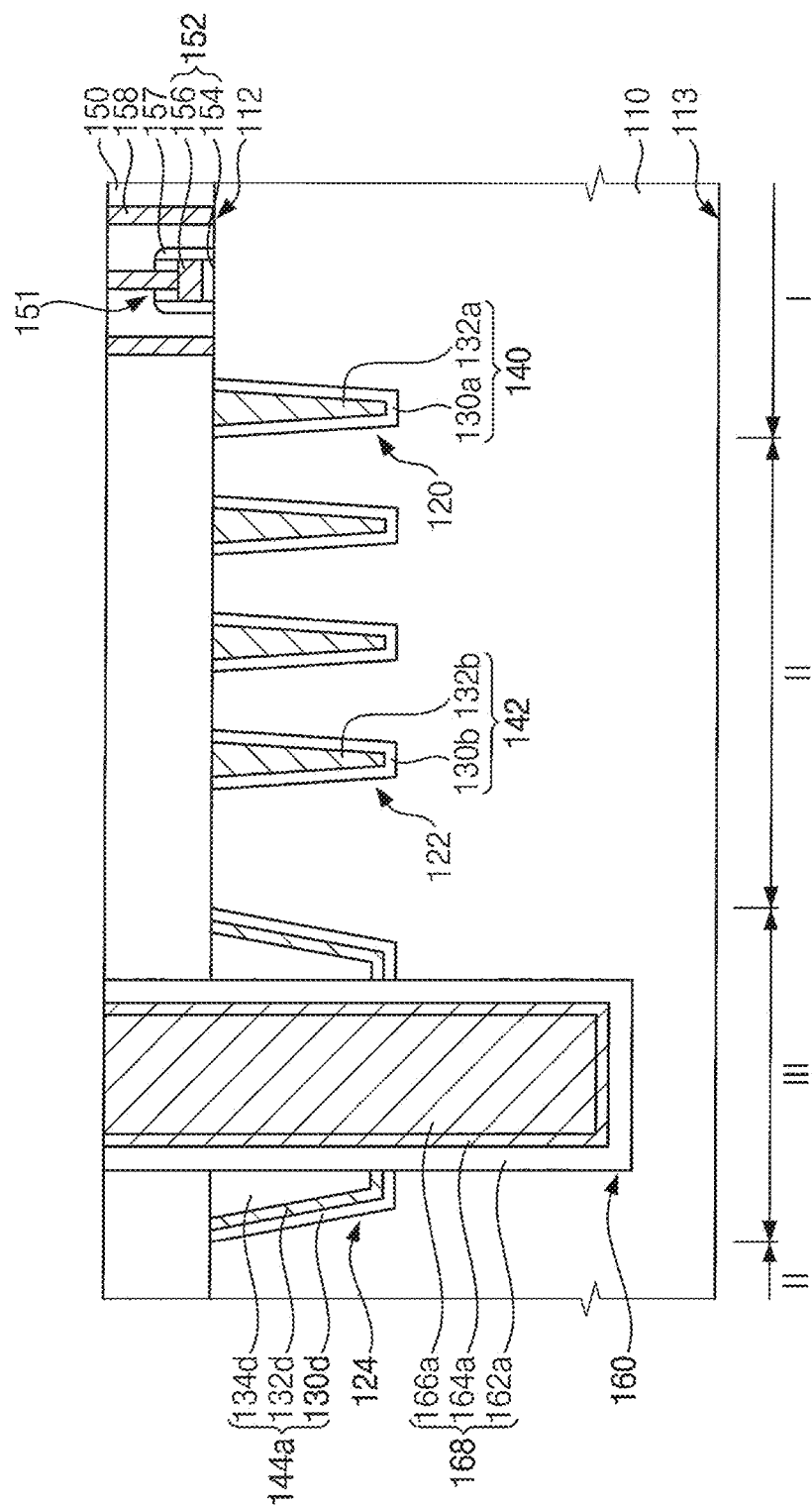

As illustrated in FIG. 13, the conductive layer 166, the barrier layer 164 and the via insulation layer 162 may be planarized through a CMP process until the top surface of the etch stop layer 159 is exposed. Accordingly, the through electrode structure 168 filling the via hole 160 may be formed. The through electrode structure 168 may include a via insulation layer pattern 162a, a barrier layer pattern 164a and a through electrode 166a sequentially formed on the inner wall of the via hole 160. When performing the CMP process, the etch stop layer 159 may function as a polishing stopper, and may have a polish-rate slower than that of copper.

The via insulation layer pattern 162a and the barrier layer pattern 164a may be formed conformally on the inner wall of the via hole 160 to have a cup shape surrounding side and bottom portions of the through electrode 166a. The through electrode 166a may have, for example, a taper, cylindrical, or polygonal column shape.

Figure 14:
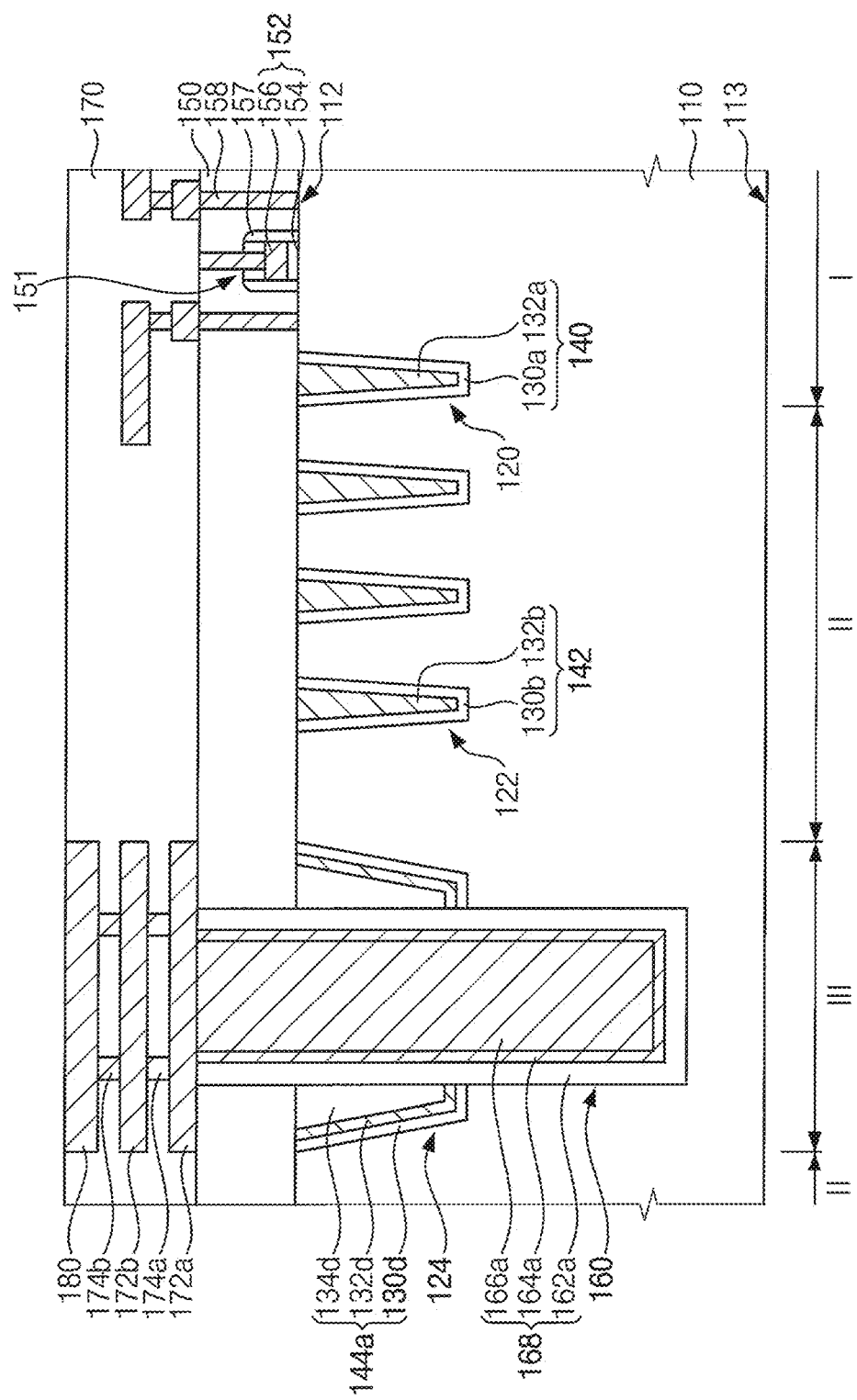

Referring to FIG. 14, an upper wiring layer 170 having a plurality of wirings may be formed on the insulation interlayer 150.

The upper wiring layer 170 may include a plurality of buffer layers and insulation layers alternately stacked. For example, the buffer layer may include silicon nitride, silicon carbon nitride, SiCON, etc. The insulation layer may include at least one of silicon oxide, carbon-doped silicon oxide, silicon carbonitride (SiCN), etc.

The upper wiring layer 170 may include a plurality of wirings therein. For example, the wiring may include a first metal wiring 172a, a first contact 174a, a second metal wiring 172b and a second contact 174b. A bonding pad 180 may be provided on the outermost insulation layer of the upper wiring layer 170. The bonding pad 180 may be exposed from the outermost insulating layer of the upper wiring layer 170.

Accordingly, the through electrode structure 168 may be electrically connected to the bonding pad 180 by the wirings. The circuit pattern 151 may be electrically connected to the bonding pad 180 by the contact plug 158 and the wirings.

Figure 15:
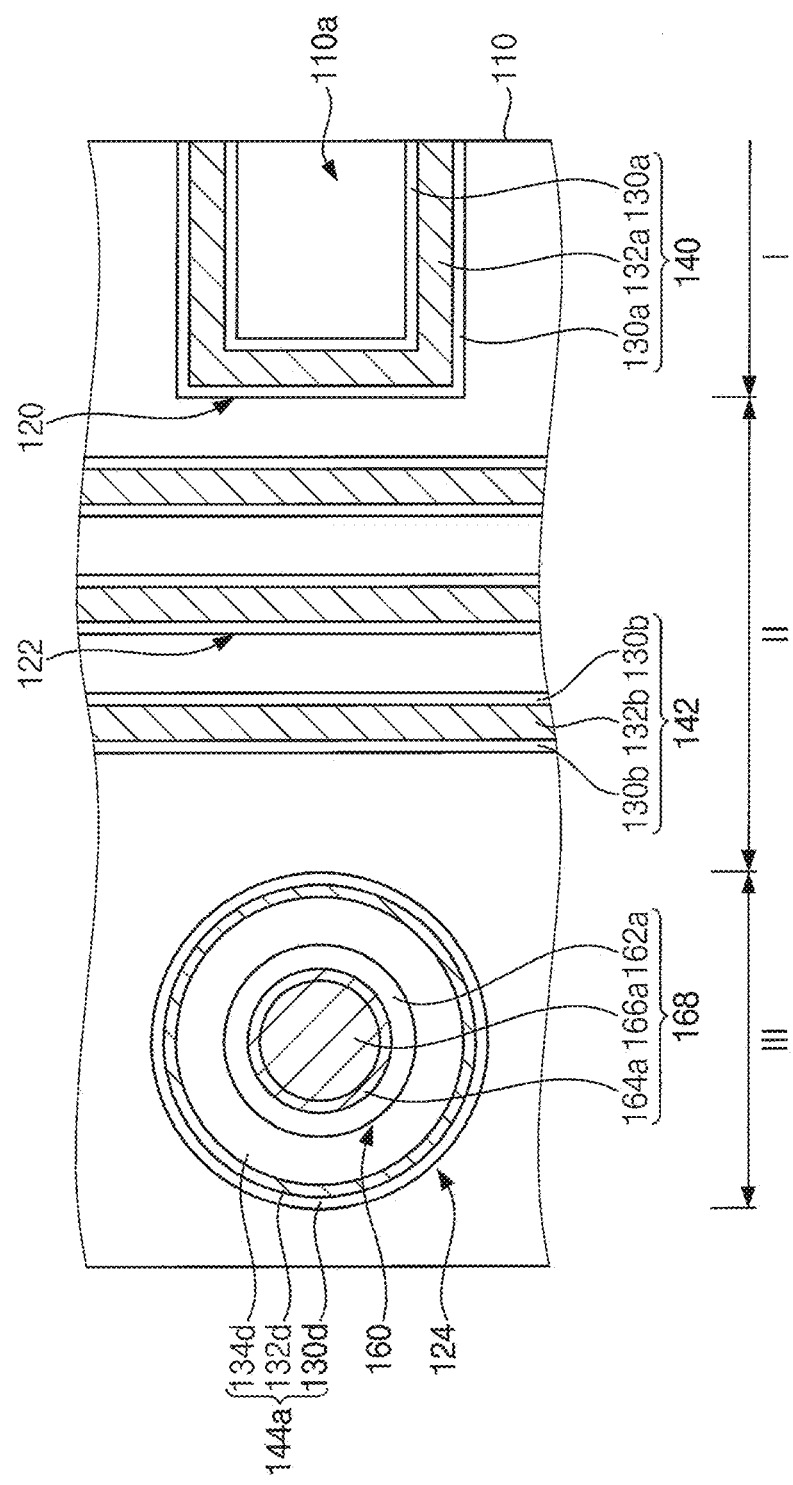

FIG. 15 is a plan view illustrating a substrate of a semiconductor device in accordance with some example embodiments. The semiconductor device may be substantially the same as or similar to the semiconductor device described with reference to FIGS. 1 and 2 except for a shape of a third isolation structure. Thus, same reference numerals will be used to refer to the same or like elements and any further repetitive explanation concerning the above elements will be omitted.

Referring to FIG. 15, a third isolation structure 144a may have a circular shape.

In some example embodiments, a third trench 124 may have an isolated shape to define a third region III. For example, the third trench 124 may have a circular shape.

The third isolation structure 144a may include a third oxide layer pattern 130d provided on an inner surface of the third trench 124, a third nitride layer pattern 132d on the third oxide layer pattern 130d and a fourth oxide layer pattern 134d on the third nitride layer pattern 132d to fill the remaining portion of the third trench 124.

It will be appreciated that the shape of the third isolation structure is not limited to a circular shape, and may have various shapes such as an octagonal shape.

Figure 16:
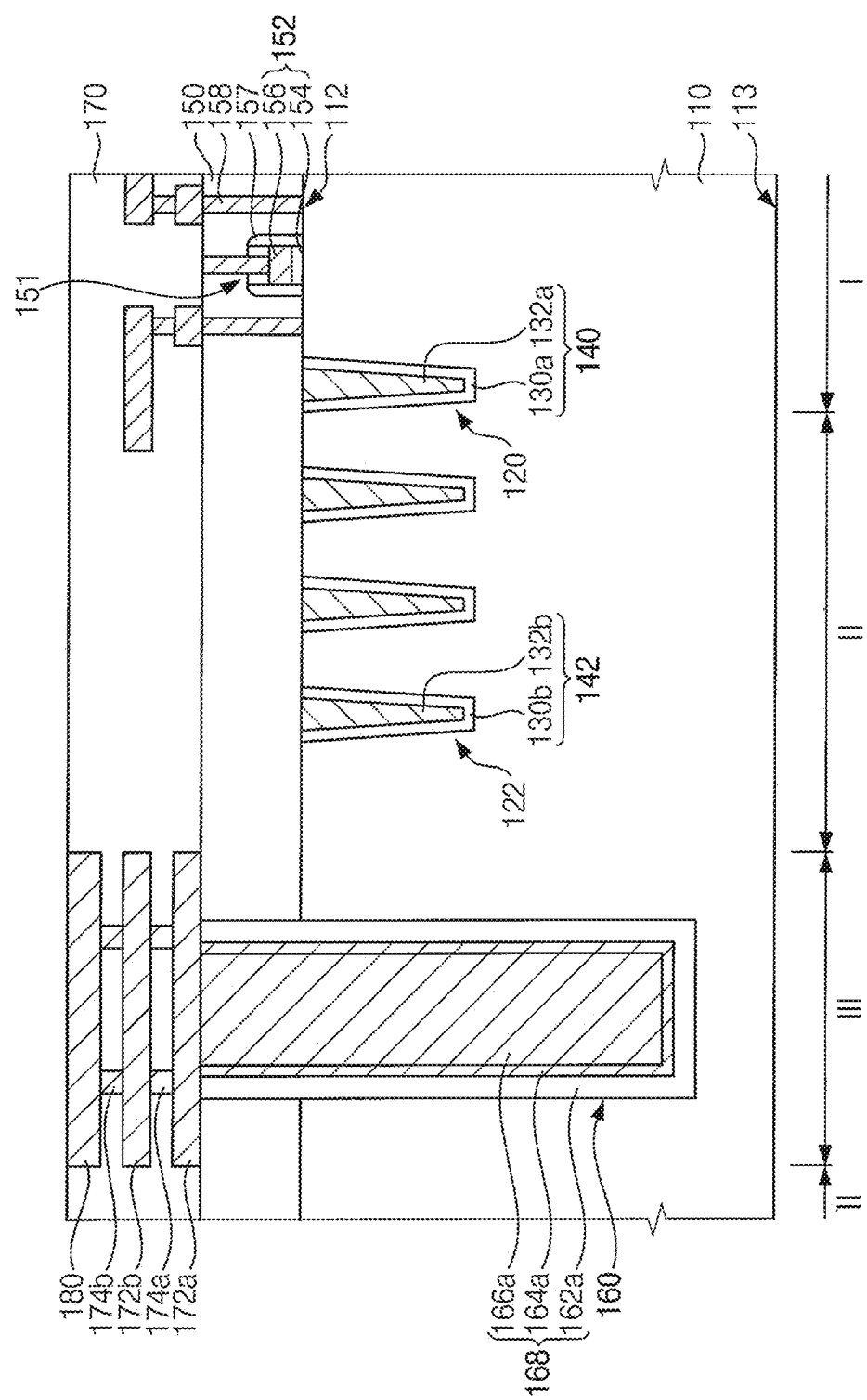
Figure 17:
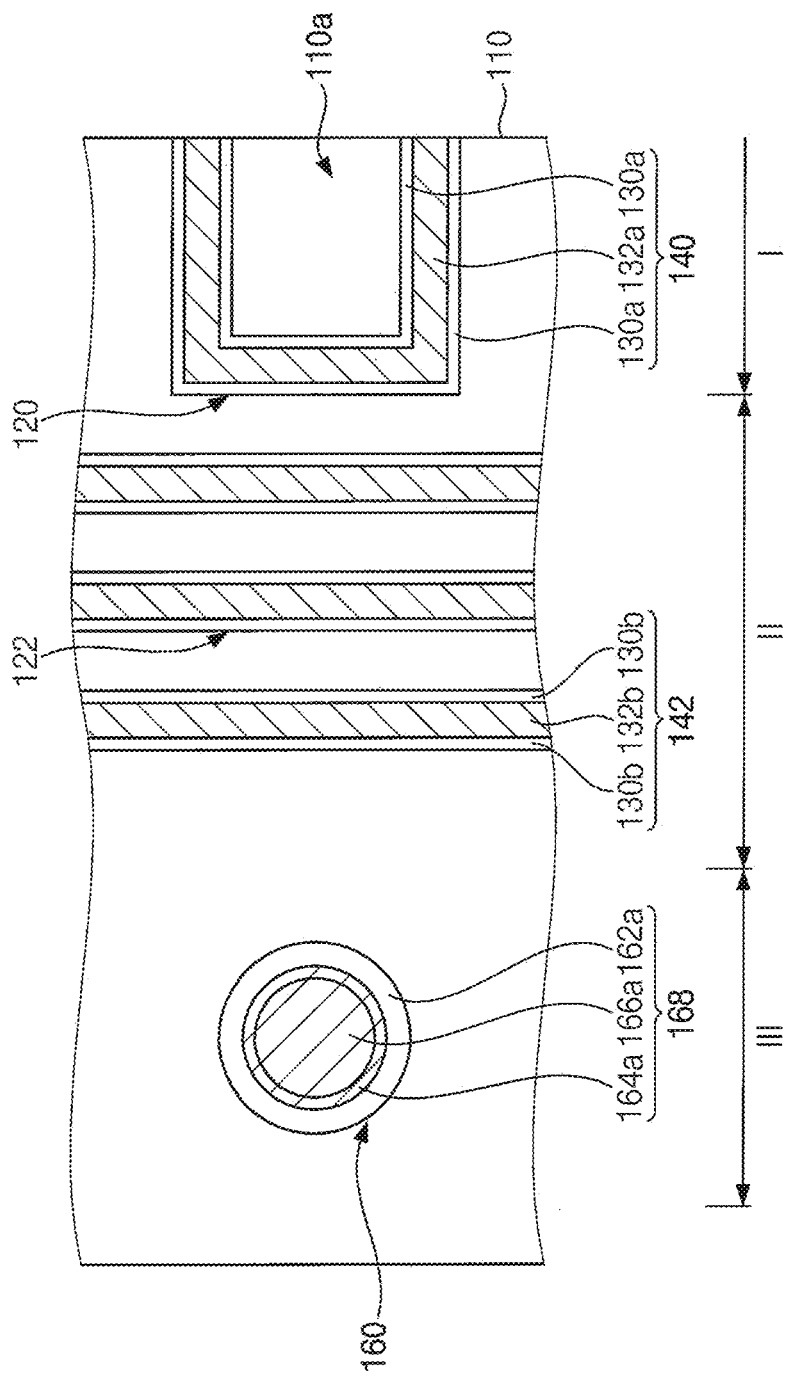

FIG. 16 is a cross-sectional view illustrating a semiconductor device in accordance with some example embodiments. FIG. 17 is a plan view illustrating a substrate of the semiconductor device in FIG. 16. The semiconductor device may be substantially the same as or similar to the semiconductor device described with reference to FIGS. 1 and 2 except that a third isolation structure is omitted. Thus, same reference numerals will be used to refer to the same or like elements and any further repetitive explanation concerning the above elements will be omitted.

Referring to FIGS. 16 and 17, isolation structures of a semiconductor device may include first and second isolation structures 140, 142.

In some example embodiments, the first isolation structure 140 may include a first oxide layer pattern 130a provided on an inner surface of a first trench 120 and a first nitride layer pattern 132a on the first oxide layer pattern 130a to fill the remaining portion of the first trench 120.

The second isolation structure 142 may include a second oxide layer pattern 130b provided on an inner surface of a second trench 122 and a second nitride layer pattern 132b on the second oxide layer pattern 130b to fill the remaining portion of the second trench 122.

Accordingly, since the third separation structure of FIG. 1 is not included, the space occupied by the oxide between a through electrode structure 168 and a circuit pattern 151 may be reduced. Thus, the stress (tensile and/or compressive stress) of a through electrode influencing on a circuit element due to shrinkage of the oxides during a manufacturing process may be reduced to thereby reduce device influences (for example, ΔIon).

Figure 18:
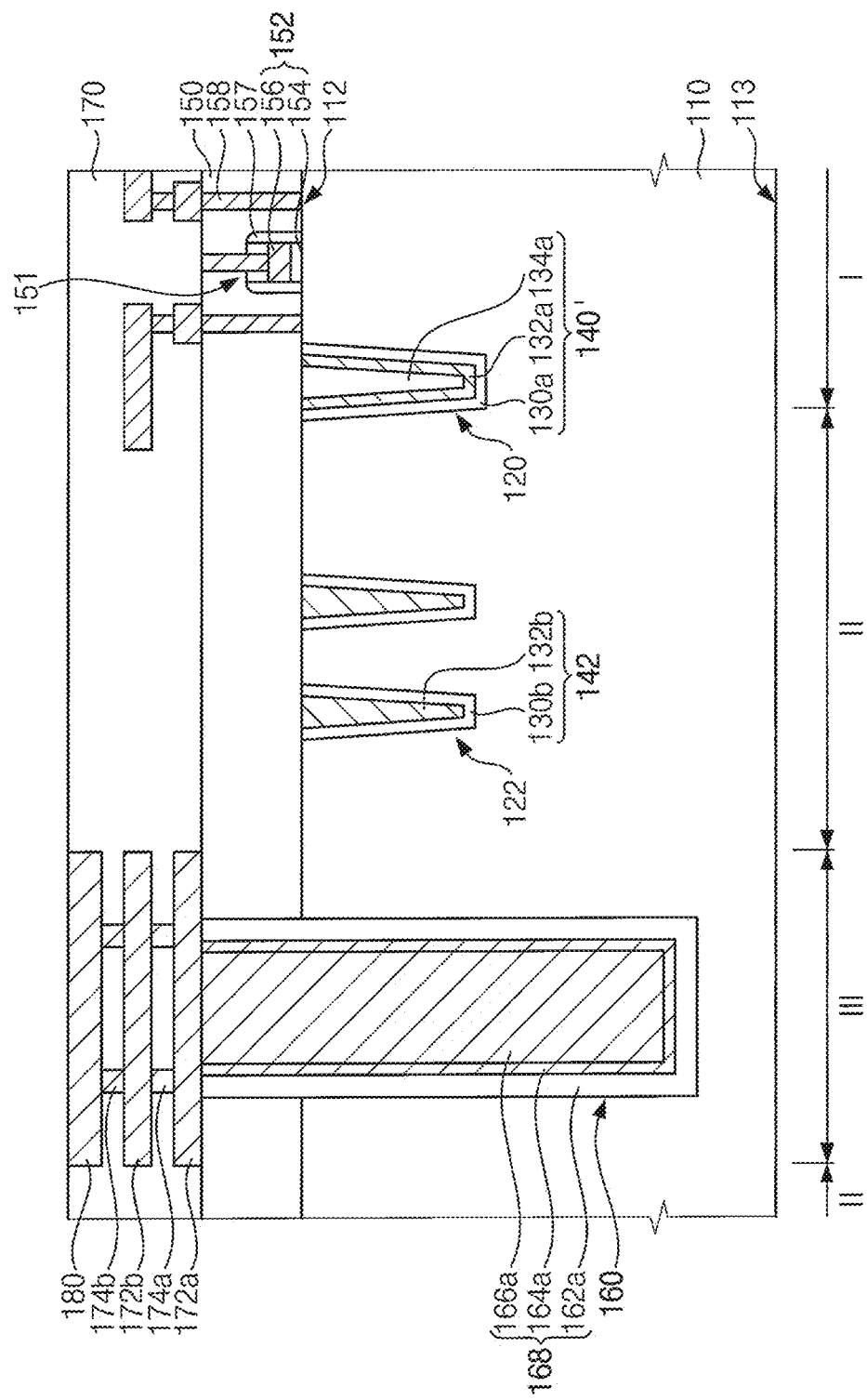
Figure 19:
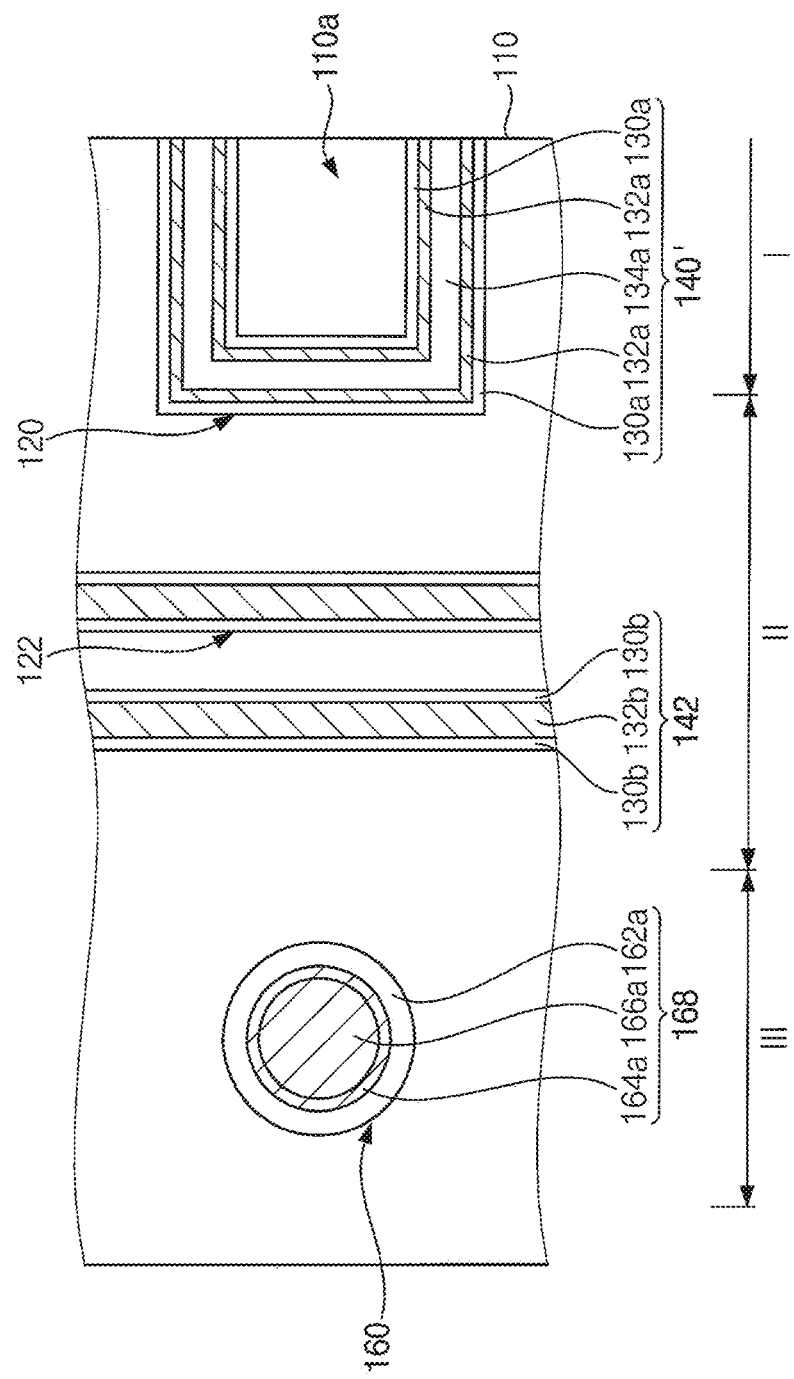

FIG. 18 is a cross-sectional view illustrating a semiconductor device in accordance with some example embodiments. FIG. 19 is a plan view illustrating a substrate of the semiconductor device in FIG. 18. The semiconductor device may be substantially the same as or similar to the semiconductor device described with reference to FIGS. 16 and 17 except for a configuration of a first isolation structure. Thus, same reference numerals will be used to refer to the same or like elements and any further repetitive explanation concerning the above elements will be omitted.

Referring to FIGS. 18 and 19, isolation structures of a semiconductor device may include first and second isolation structures 140', 142.

In some example embodiments, the first isolation structure 140' may include a first oxide layer pattern 130a provided on an inner surface of a first trench 120, a first nitride layer pattern 132a on the first oxide layer pattern 130a and a fifth oxide layer pattern 134a on the first nitride layer pattern 32a to fill the remaining portion of the first trench 120.

The second isolation structure 142 may include a second oxide layer pattern 130b provided on an inner surface of a second trench 122 and a second nitride layer pattern 132b on the second oxide layer pattern 130b to fill the remaining portion of the second trench 122.

Figure 20:
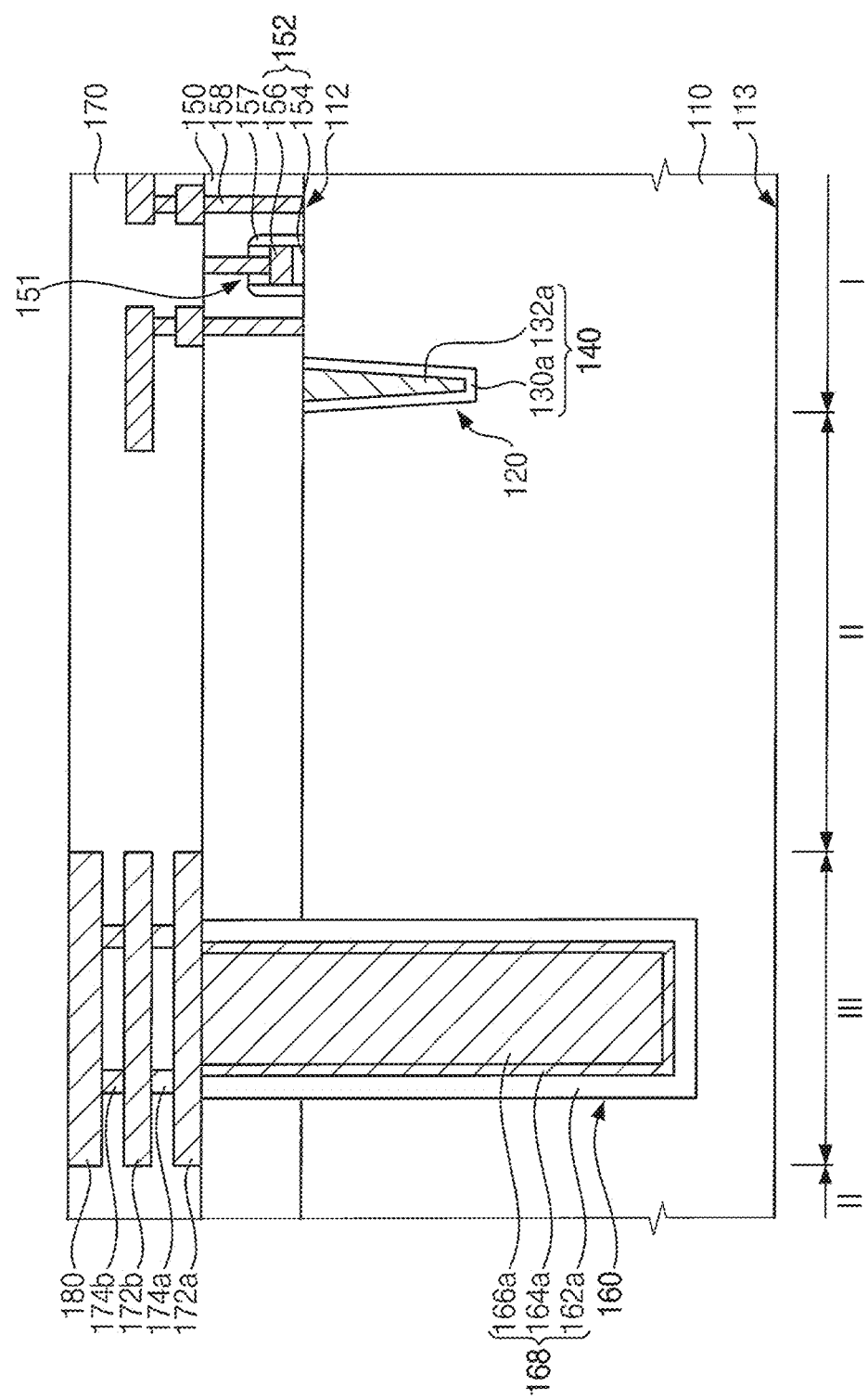
Figure 21:
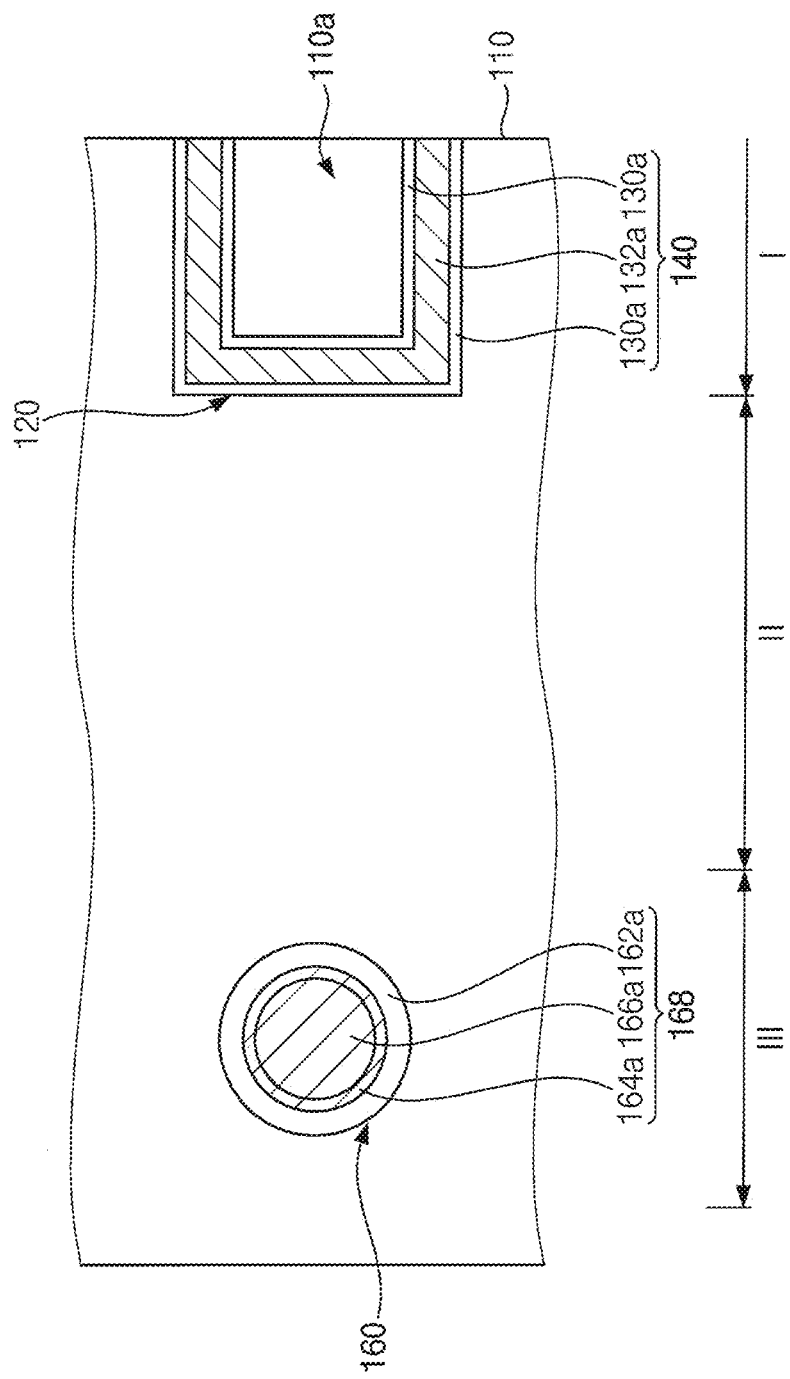

FIG. 20 is a cross-sectional view illustrating a semiconductor device in accordance with some example embodiments. FIG. 21 is a plan view illustrating a substrate of the semiconductor device in FIG. 20. The semiconductor device may be substantially the same as or similar to the semiconductor device described with reference to FIGS. 16 and 17 except that a second isolation structure is omitted. Thus, same reference numerals will be used to refer to the same or like elements and any further repetitive explanation concerning the above elements will be omitted.

Referring to FIGS. 20 and 21, a semiconductor device may include a first isolation structure 140.

In some example embodiments, the first isolation structure 140 may include a first oxide layer pattern 130a provided on an inner surface of a first trench 120 and a first nitride layer pattern 132a on the first oxide layer pattern 130a to fill the remaining portion of the first trench 120.

Accordingly, since the second separation structure of FIG. 16 is not included, the space occupied by the oxide between a through electrode structure 168 and a circuit pattern 151 may be reduced. Thus, the stress (tensile and/or compressive stress) of a through electrode influencing on a circuit element due to shrinkage of the oxides during a manufacturing process may be reduced to thereby reduce device influences (for example, ΔIon).

Figure 22:
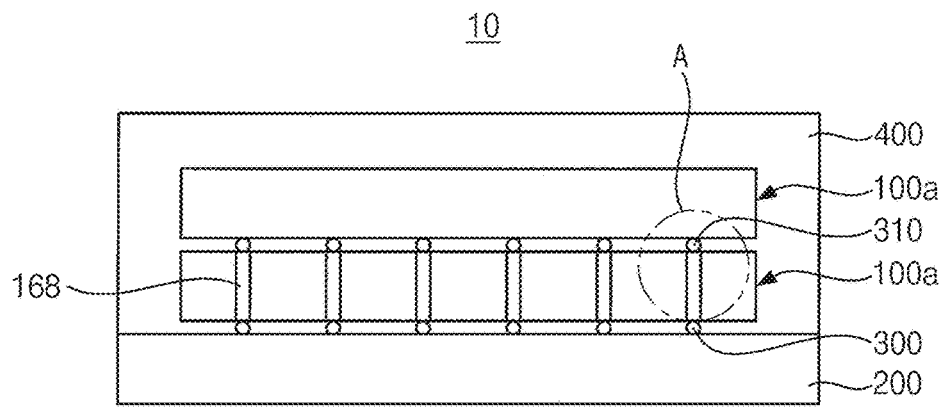
Figure 23:
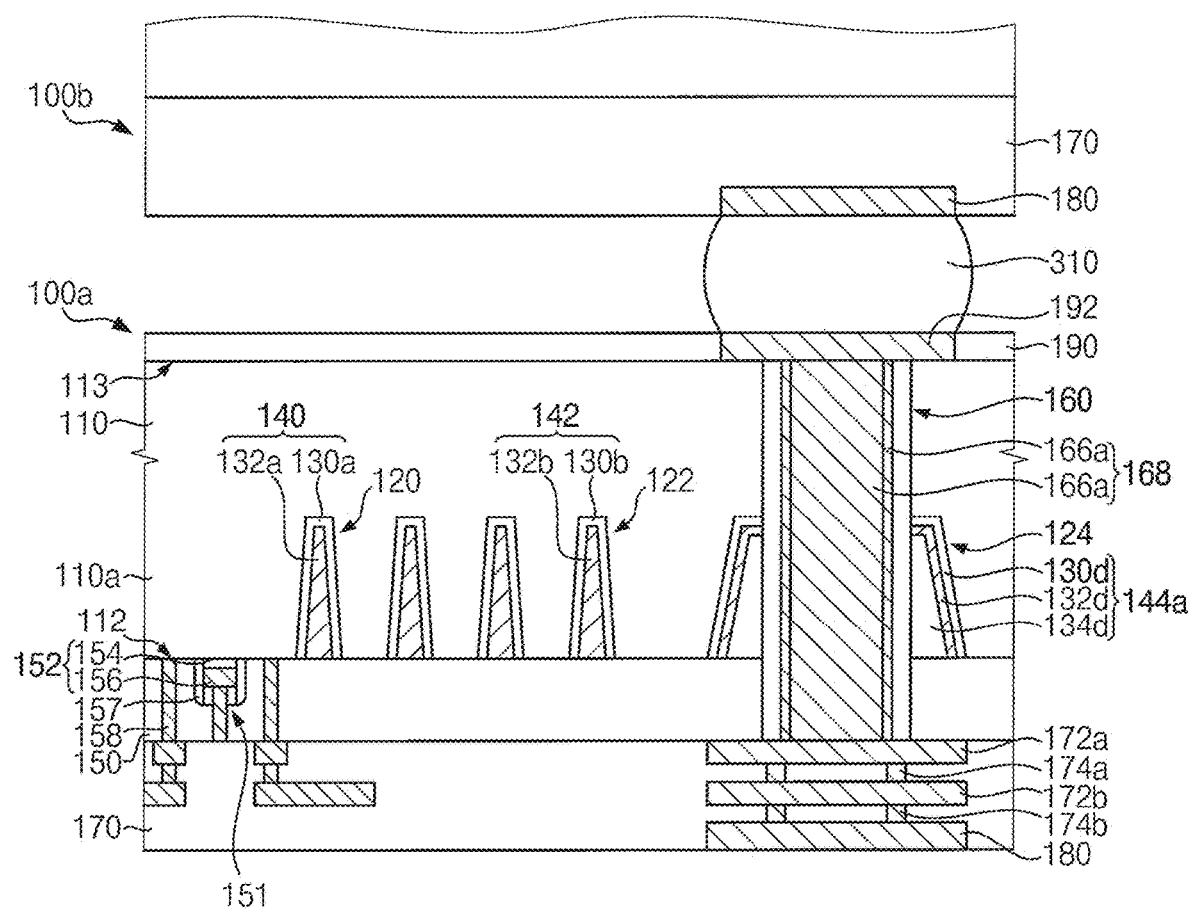

FIG. 22 is a cross-sectional view illustrating a semiconductor package in accordance with some example embodiments. FIG. 23 is an enlarged cross-sectional view illustrating portion 'A' in FIG. 22. The semiconductor package may include the semiconductor device described with reference to FIGS. 1 and 2. Thus, same reference numerals will be used to refer to the same or like elements and any further repetitive explanation concerning the above elements will be omitted.

Referring to FIGS. 22 and 23, a semiconductor package 10 may include a package substrate 200, first and second semiconductor chips 100a, 100b sequentially stacked on the package substrate 200 and a molding member 400. Additionally, the semiconductor package 10 may further include conductive bumps 310, 320 and outer connection members (not illustrated).

The package substrate 200 may be a printed circuit board (PCB) including circuit patterns therein. Substrate pads may be provided on an upper surface of the package substrate 200, and the outer connection members 800 such as solder balls may be provided on a lower surface of the package substrate 500.

The first and second semiconductor chips 100a, 100b as described with reference to FIG. 1 may be stacked on the package substrate 200. In some example embodiments, the semiconductor package as multi-chip package including two stacked semiconductor chips 100a, 100b are exemplarily illustrated, and thus, it may not be limited thereto, and for example, the semiconductor package may include 4, 8, 12 or 16 stacked semiconductor chips.

Each of the first and second semiconductor chips 100a, 100b may include an integrated circuit chip completed by performing semiconductor manufacturing processes. Each of the semiconductor chips may include, for example, a memory chip or a logic chip.

The first conductive bumps 300 may be interposed between the package substrate 200 and the first semiconductor chip 100a. The first conductive bump 300 may electrically connect the substrate pad of the package substrate 200 and a first bonding pad 180 of the first semiconductor chip 100a to each other.

The second conductive bumps 310 may be interposed between the first semiconductor chip 100a and the second semiconductor chip 100b. As illustrated in FIG. 22, the second conductive bump 310 may electrically connect a second bonding pad 190 of the first semiconductor chip 100a and a first bonding pad 180 of the second semiconductor chip 100b to each other.

Alternatively, the second conductive bumps may be omitted, and the second bonding pad 190 of the first semiconductor chip 100a and the first bonding pad 180 of the second semiconductor chip 100b may be directly bonded to each other (for example, Cu—Cu Hybrid Bonding).

The molding member 400 may be provided on the package substrate 200 to cover the first and second semiconductor chips 100a, 100b. The molding member 400 may include an epoxy molding compound (EMC) material.

Hereinafter, a method of manufacturing the semiconductor package in FIG. 22 will be explained.

First, the substrate 110 in FIG. 14 may be turned over using a carrier substrate such that the second surface 113 of the substrate 110 faces upward. Then, a portion of the through electrode structure 168 may be exposed by polishing the second surface 113 of the substrate 110. Accordingly, the thickness of the substrate 110 may be reduced.

Then, an insulation layer 190 having a second bonding pad 192 may be formed on the second surface 113 of the substrate 110.

For example, an insulation layer may be formed on the second surface 113 of the substrate 110, the insulation layer may be patterned to form an opening exposing an end portion of the through electrode structure 168, and a plating process may be performed to form the second bonding pad 92. The insulation layer may be formed of silicon oxide, carbon-doped silicon oxide, silicon carbonitride (SiCN), etc.

Accordingly, the first semiconductor chip 100b having the first bonding pad 180 and the second bonding pad 192 electrically connected to the through electrode structure 168 may be completed.

Then, second conductive bumps 310 may be formed on the first bonding pads 180 of the second semiconductor chip 100b, and the second semiconductor chip 100b may be stacked on the first semiconductor chip 100a through the second conductive bumps 310.

For example, after disposing the second conductive bump 310 on the first bonding pad 180 of the second semiconductor chip 110b, the second semiconductor chip 110b may be bonded onto the first semiconductor chip 110a through, for example, a reflow process.

Then, the carrier substrate may be removed, and the first semiconductor chip 100a on which the second semiconductor chip 110b is stacked may be mounted on the package substrate 200 by using the first conductive bumps 300, to manufacture the semiconductor package in FIG. 21.

The semiconductor package may include semiconductor devices such as logic devices or memory devices. The semiconductor package may include logic devices such as at least one of central processing units (CPUs), main processing units (MPUs), or application processors (APs), or the like, and volatile memory devices such as at least one of DRAM devices, HBM devices, or non-volatile memory devices such as flash memory devices, PRAM devices, MRAM devices, ReRAM devices, or the like.

The foregoing is illustrative of some example embodiments and is not to be construed as limiting thereof. Although a few some example embodiments have been described, those skilled in the art will readily appreciate that many modifications are possible in some example embodiments without materially departing from the novel teachings and advantages of the present invention. Accordingly, all such modifications are intended to be included within the scope of some example embodiments as defined in the claims.

What is claimed is:

1. A semiconductor device, comprising:
a substrate having a first surface and a second surface opposite to each other, the substrate having a via hole extending in a thickness direction from the first surface;
a circuit pattern in the first surface of the substrate;
a through electrode structure in the via hole;
a first device isolation structure in a first trench extending in one direction in the first surface of the substrate, the first device isolation structure between the via hole and the circuit pattern, the first device isolation structure including a first oxide layer pattern and a first nitride layer pattern sequentially stacked on an inner surface of the first trench, the first nitride layer pattern filling the first trench, and an upper surface of the first nitride layer pattern coplanar with an upper surface of the substrate and an upper surface of the first oxide layer pattern;
a second device isolation structure in a second trench encompassing the through electrode structure, the second device isolation structure including a second oxide layer pattern on an inner surface of the second trench, a second nitride layer pattern on the second oxide layer pattern, and a third oxide layer pattern on the second nitride layer pattern, each of the second oxide layer pattern, the second nitride layer pattern, and the third oxide layer pattern of the second device isolation structure contracting a sidewall of the through electrode structure; and
an insulation interlayer on the first surface of the substrate and covering the circuit pattern.

2. The semiconductor device of claim 1, wherein the circuit pattern is on an active pattern in a circuit region defined by the first trench.

3. The semiconductor device of claim 1, wherein the first trench is spaced apart from the via hole by a distance of between 5 μm to 15 μm.

4. The semiconductor device of claim 1, wherein a ratio (D/W1) of a diameter D of the via hole to a width W1 of the first trench is within a range of 50 to 150.

5. The semiconductor device of claim 1, wherein the first oxide layer pattern is on the inner surface of the first trench, and the first nitride layer pattern is on the first oxide layer pattern, the first nitride layer pattern filling a remaining portion of the first trench.

6. The semiconductor device of claim 1, further comprising:
at least one dummy isolation structure in at least one third trench extending in one direction in the first surface of the substrate, the at least one dummy isolation structure between the via hole and the first trench, the at least one dummy isolation structure including a fourth oxide layer pattern and a third nitride layer pattern sequentially stacked on an inner surface of the second trench, the third nitride layer pattern filling the third trench.

7. The semiconductor device of claim 6, wherein the first oxide layer pattern and the fourth oxide layer pattern include a same first insulation material, and the first nitride layer pattern and the third nitride layer pattern include a same second insulation material.

8. The semiconductor device of claim 1, wherein the first device isolation structure further comprises an oxide layer pattern on the first nitride layer pattern, the oxide layer pattern filling a remaining portion of the first trench.

9. The semiconductor device of claim 1, wherein the first oxide layer pattern and the third oxide layer pattern include a same first insulation material, and the first nitride layer pattern and the second nitride layer pattern include a same second insulation material.

10. A semiconductor device, comprising:
a substrate having a first region and a second region;
a circuit pattern in the first region of the substrate;
a through electrode structure penetrating through at least a portion of the second region of the substrate;
a first isolation structure in a first trench, the first isolation structure extending in one direction in the substrate and defining the first region, the first isolation structure including a first oxide layer pattern and a first nitride layer pattern sequentially stacked on an inner surface of the first trench, the first nitride layer pattern filling the first trench, and an upper surface of the first nitride layer pattern coplanar with an upper surface of the substrate and an upper surface of the first oxide layer pattern;
a second isolation structure in a second trench encompassing the through electrode structure, the second isolation structure including a second oxide layer pattern on an inner surface of the second trench, a second nitride layer pattern on the first oxide layer pattern, and a third oxide layer pattern on the second nitride layer pattern, each of the second oxide layer pattern, the second nitride layer pattern, and the third oxide layer pattern of the second isolation structure contacting a sidewall of the through electrode structure; and
an insulation interlayer on the substrate and covering the circuit pattern.

11. The semiconductor device of claim 10, wherein the circuit pattern is on an active pattern, the active pattern in the first region.

12. The semiconductor device of claim 10, wherein the first trench is spaced apart from the through electrode structure by a distance of between 5 μm to 15 μm.

13. The semiconductor device of claim 10, wherein a ratio (D/W1) of a diameter D of the through electrode structure to a width W1 of the first trench is within a range of 50 to 150.

14. The semiconductor device of claim 10, further comprising:
at least one third isolation structure in at least one third trench extending in one direction in the substrate, the at least one third isolation structure in a third region between the first region and the second region, the at least one third isolation structure including a fourth oxide layer pattern and a third nitride layer pattern sequentially stacked on an inner surface of the third trench, the third nitride layer pattern filling the third trench.

15. The semiconductor device of claim 14, wherein the first oxide layer pattern and the fourth oxide layer pattern include a same first insulation material, and the first nitride layer pattern and third nitride layer pattern include a same second insulation material.

16. The semiconductor device of claim 10, wherein the second
isolation structure in the second trench defines the second region, and
the third oxide layer pattern fills a remaining portion of the second trench.

17. The semiconductor device of claim 16, wherein the first oxide layer pattern and the second oxide layer pattern include a same first insulation material, and the first nitride layer pattern and the second nitride layer pattern include a same second insulation material.

18. The semiconductor device of claim 10, wherein the through electrode structure comprises a through electrode and a via insulation layer pattern surrounding a sidewall of the through electrode.

19. A semiconductor device, comprising:
- a substrate having a circuit region, a via region, and a buffer region between the circuit region and the via region;
- a circuit pattern in the circuit region of the substrate;
- a through electrode structure penetrating at least a portion of the via region of the substrate;
- a device isolation structure in a first trench extending in one direction in the substrate, the device isolation structure defining the circuit region, and including a first oxide layer pattern on an inner surface of the first trench and a first nitride layer pattern on the first oxide layer pattern, the first nitride layer pattern filling a remaining portion of the first trench, and an upper surface of the first nitride layer pattern coplanar with an upper surface of the substrate and an upper surface of the first oxide layer pattern;
- at least one dummy isolation structure in at least one second trench extending in one direction in the substrate, the at least one dummy isolation structure in the buffer region, the at least one dummy isolation structure including a second oxide layer pattern on an inner surface of the second trench and a second nitride layer pattern on the second oxide layer pattern, the second nitride layer pattern filling a remaining portion of the second trench;
- a second device isolation structure in a third trench in the via region encompassing the through electrode structure, the second device isolation structure including a third oxide layer pattern on an inner surface of the third trench, a third nitride layer pattern on the third oxide layer pattern, and a fourth oxide layer pattern on the third nitride layer pattern, each of the third oxide layer pattern, the third nitride layer pattern, and the fourth oxide layer pattern of the second device isolation structure contacting a sidewall of the through electrode structure; and
- an insulation interlayer on the substrate and covering the circuit pattern,
- wherein the first trench is spaced apart from the through electrode structure by a distance of between 5 μm to 15 μm.

* * * * *